(12) United States Patent
Gardner et al.

(10) Patent No.: US 11,276,704 B2
(45) Date of Patent: Mar. 15, 2022

(54) DEVICE AND METHOD OF FORMING WITH THREE-DIMENSIONAL MEMORY AND THREE-DIMENSIONAL LOGIC

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 50 days.

(21) Appl. No.: 16/801,747

(22) Filed: Feb. 26, 2020

(65) Prior Publication Data

US 2021/0111183 A1 Apr. 15, 2021

Related U.S. Application Data

(60) Provisional application No. 62/914,150, filed on Oct. 11, 2019.

(51) Int. Cl.
| | |
|---|---|
| *H01L 27/11573* | (2017.01) |
| *H01L 29/66* | (2006.01) |
| *H01L 29/78* | (2006.01) |
| *H01L 27/1157* | (2017.01) |
| *H01L 27/11582* | (2017.01) |
| *H01L 27/11565* | (2017.01) |
| *H01L 27/092* | (2006.01) |

(52) U.S. Cl.
CPC .... *H01L 27/11573* (2013.01); *H01L 27/0924* (2013.01); *H01L 27/1157* (2013.01); *H01L 27/11565* (2013.01); *H01L 27/11582* (2013.01); *H01L 29/66795* (2013.01); *H01L 29/785* (2013.01)

(58) Field of Classification Search
CPC .................................................. H01L 29/42392
See application file for complete search history.

(56) References Cited

U.S. PATENT DOCUMENTS

| | | |
|---|---|---|
| 8,846,508 B1 | 9/2014 | England et al. |
| 9,449,987 B1 | 9/2016 | Miyata et al. |
| 9,543,318 B1 | 1/2017 | Lu et al. |
| 9,583,536 B2 | 2/2017 | Lai et al. |
| 10,038,053 B2 | 7/2018 | Balakrishnan et al. |
| 10,043,819 B1* | 8/2018 | Lai ..................... H01L 27/11582 |
| 10,056,254 B2 | 8/2018 | Balakrishnan et al. |
| 10,332,900 B2 | 6/2019 | Yun et al. |
| 2015/0372005 A1* | 12/2015 | Yon ................... H01L 27/11573 |
| | | 257/5 |

(Continued)

OTHER PUBLICATIONS

International Search Report and Written Opinion dated Dec. 2, 2020 in PCT/US2020/047483, 9 pages.

*Primary Examiner* — Yu-Hsi D Sun
(74) *Attorney, Agent, or Firm* — Oblon, McClelland, Maier & Neustadt, L.L.P.

(57) ABSTRACT

A method for forming a semiconductor device is provided. In the disclosed method, a stack is formed on a working surface of a substrate. The stack has alternating first layers and second layers positioned over the substrate. A separation structure is formed in the stack that separates the stack into a first region and a second region, where the separation structure extends in a first direction of the substrate. The second layers in the second region are further replaced with insulating layers, and the first layers in the second region are doped with a dopant.

19 Claims, 19 Drawing Sheets

(56) References Cited

U.S. PATENT DOCUMENTS

| | | |
|---|---|---|
| 2017/0025473 A1 | 1/2017 | Lai et al. |
| 2017/0104060 A1 | 4/2017 | Balakrishnan et al. |
| 2017/0194143 A1 | 7/2017 | Balakrishnan et al. |
| 2018/0247950 A1 | 8/2018 | Yun et al. |

\* cited by examiner

DEVICE AND METHOD OF FORMING WITH THREE-DIMENSIONAL MEMORY AND THREE-DIMENSIONAL LOGIC

FIELD OF THE INVENTION

This disclosure relates to integrated circuits and the fabrication of microelectronic devices. Specially, the present disclosure relates to forming a semiconductor device that has three-dimensional memory structures and three-dimensional logic transistors over a substrate.

BACKGROUND

In the manufacture of a semiconductor device (especially on the microscopic scale), various fabrication processes are executed such as film-forming depositions, etch mask creation, patterning, photoresist development, material etching and removal, as well as doping treatments. These processes are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other. Fabrication of 3D semiconductor devices poses many new and unique challenges associated with scaling, post-fabrication processing, as well as other aspects of the 3D fabrication process.

SUMMARY 3D integration is seen as a viable option to continue semiconductor scaling in spite of inevitable saturation in critical dimension scaling. As the contacted gate pitch reaches its scaling limit due to manufacturing variability and electrostatic device limitations, two-dimensional transistor density scaling stops. Even experimental new transistor designs, such as vertical channel gate-all-around transistors, that may be able to one day overcome these contacted gate pitch scaling limits, do not promise to get semiconductor scaling back on track because resistance, capacitance, and reliability concerns limit wire pitch scaling, thereby limiting the density with which transistors can be wired into circuits.

3D integration, i.e. the vertical stacking of multiple devices, aims to overcome these scaling limitations by increasing transistor density in volume rather than area. This idea has been successfully demonstrated and implemented by the flash memory industry with the adoption of 3D NAND. Mainstream CMOS VLSI scaling, as used for example in CPU or GPU products, is exploring adoption of 3D integration as a primary means of moving the semiconductor roadmap forward, and thus desires enabling technologies.

Techniques herein provide a circuit and method of fabrication that includes 3D logic adjacent to 3D NAND memory on a same die or chip. Such chips can also include high-performance 3D SRAM. Techniques herein using a same, initial nano-sheet stack to form vertical stacks of gate-all-around field-effect transistor devices, as well as vertical stacks of memory cells. Thus the logic cells and the memory cells can be formed in adjacent regions, starting from a same initial stack of layers (nano sheet stack).

Techniques herein enable 3D logic to using single-crystal silicon for channel material from epitaxial silicon growth. For example, alternating layers of silicon and silicon-germanium. In regions for NAND memory, silicon-germanium is replaced with a dielectric such as silicon oxide. Accordingly a stack of Si/SiGe/Si/SiGe is essentially converted to a stack of Si/SiO/Si/SiO. Any type of 3D NAND cell can then be formed. Techniques herein also enable a single-crystal silicon vertical channel and NAND word line for both high-performance 3D NAND and adjacent 3D Logic and SRAM. Memory cells can be formed while the epitaxial stack for logic is covered. Removal and replace of SiGe can be realized in two stages with temporary support structures to suspend layers of silicon while silicon is doped and a dielectric is used as a replacement.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a method for forming a semiconductor device is provided. In the disclosed method, a stack is formed on a working surface of a substrate. The stack has alternating first layers and second layers positioned over the substrate. A separation structure is formed in the stack that separates the stack into a first region and a second region, where the separation structure extends in a first direction of the substrate. The second layers in the second region are further replaced with insulating layers, and the first layers in the second region are doped with a dopant.

In some embodiments, in order to form the stack, the first layers and the second layers can be deposited alternatively through an epitaxy growth process over the substrate. The first layers can be made of silicon, and the second layers can be made of silicon germanium. The first layers in the second region can be doped with an N-type dopant.

In order to replace the second layers in the second region with the insulating layers, a plurality of trenches can be formed along the first direction of the substrate in the second region to separate the second region into fin structures while the first region is protected. The fin structures can include the alternating first layers and second layers. The trenches and the fin structures can be arranged alternatingly along a second direction of the substrate that is perpendicular to the first direction of the substrate. Subsequently, first support structures can be formed over the substrate. The first support structures can extend in the second direction of the substrate, and be positioned at the trenches so that first portions of the fin structures are uncovered by the first support structures and second portions of the fin structures are covered by the first support structures. Further, first portions of the second layers can be removed in the first portions of the fin structures.

After the first portions of the second layers are removed in the first portions of the fin structures, first portions of the first layers can be doped in the first portions of the fin structures with the dopant. The first portions of the second layers in the first portions of the fin structures can be replaced with the insulating layers. Subsequently, the first support structures can be removed. Second support structures can then be formed. The second support structures extend in the second direction of the substrate, and are positioned at the trenches so that the first portions of the fin structures are covered by the second support structures and the second portions of the fin structures are uncovered. Second portions of the second layers can be removed in the second portions of the fin structures. Second portions of the first layers in the second portions of the fin structures can be doped with the dopant. The second portion of the second layers in the second portions of the fin structures can then be replaced with the insulating layers. The second support structures can further be removed so that the fin structures include the insulating layers and the doped first layers that are arranged alternatingly on the working surface of the substrate.

In the disclosed method, a 3D NAND device can be formed in one of the fin structures in the second region. In order to form the 3D NAND device in the one of the fin structures in the second region, an etching process can be performed to form staircase regions and an array region in the one of the fin structures. The array region can be positioned between the staircase regions. An channel structure can be formed in the array region of the one of the fin structures, where the channel structure passes through the one of the fin structures and extends along a third direction of the substrate that is perpendicular to the substrate. Wordline contacts can subsequently be formed in the staircase regions. The wordline contacts land on the first layers of the one of the fin structures, and further extend along the third direction of the substrate.

In some embodiments, in order to form the channel structure, a channel opening can be formed in the one of the fin structures, where the channel opening passes through the one of the fin structures along the third direction of the substrate and further extends into the substrate. The channel opening can have sidewalls and a bottom. A blocking layer can be formed along the sidewalls of the channel opening and positioned over the bottom of the channel opening. A charge storage layer can be formed over the blocking layer in the channel opening. A tunneling layer can be formed over the charge storage layer in the channel opening. Further, an etching process can be performed to remove a portion of the blocking layer, a portion of the charge storage layer, and a portion of the tunneling layer that are positioned over the bottom of the channel opening. A bottom channel contact can subsequently be formed at the bottom of the channel opening, where the bottom channel contact further extends in the substrate. A channel layer can be formed in the channel opening. The channel layer is disposed over the tunneling layer and positioned along the sidewalls of the channel opening. The channel layer can further be positioned on the bottom channel contact. A top channel contact can be formed on the channel layer.

In the disclosed method, a stack of gate-all-around field-effect transistors (GAA-FETs) can be formed in the first region that is positioned over the substrate. In order to form the stack of GAA-FETs in the first region, a first layer of the stack of GAA-FETs can be formed over the substrate. The first layer of the stack of GAA-FETs can include first GAA-FETs, where source/drain regions and channel regions of the first GAA-FETs can be disposed alternatingly and arranged along a top surface of the substrate. In addition, a second layer of the stack of GAA-FETs can be formed over the first layer of the stack of GAA-FETs. The second layer of the stack of GAA-FETs can have second GAA-FETs, where source/drain regions and channel regions of the second GAA-FETs can be disposed alternatingly and positioned along the top surface of the substrate.

In some embodiments, the first GAA-FETs can be are N-type transistors and the second GAA-FETs can be P-type transistors. In addition, the channel regions of the first GAA-FETs and the channel regions of the second GAA-FETs can be formed in the first layers.

According to another aspect of the disclosure, a semiconductor device is provided. The semiconductor device includes a first region on a die. The first region has a stack of gate-all-around field-effect transistors (GAA-FETs) positioned over a substrate. The stack of GAA-FETs can be formed based on a first stack of alternating first layers and second layers. Each layer of the stack of GAA-FETs can include respective GAA-FETs, where source/drain regions and channel regions of the respective GAA-FETs in each layer of the stack of GAA-FETs are disposed alternatingly and extend along a top surface of the substrate. The channel regions of the respective GAA-FETs in each layer of the stack of GAA-FETs can be formed based on the first layers of the first stack. The semiconductor device also includes a second region on the die that is positioned adjacent to the first region. The second region has an array of vertically-oriented NAND memory cells that are formed in a second stack. The second stack includes the first layers and insulating layers that are positioned alternatingly over the substrate, where the first layers in the second stack can function as wordline layers of the array of vertically-oriented NAND memory cells. In addition, the first stack and the second stack are formed from an epitaxial stack so that the first layers in the first stack align with the first layers in the second stack.

In some embodiments, the epitaxial stack can include the first layers and the second layers that are disposed alternatingly on the substrate. In some embodiments, the first layers can be made of silicon and the second layers can be made of SiGe. In some embodiments, the epitaxial stack can be separated into the first stack and the second stack by a separation structure, where the separation structure extends in a first direction of the substrate.

In some embodiments, the second layers in the second stack can be replaced with the insulating layers in a manufacturing step. The first layers in the second stack can be doped with a dopant.

The array of vertically-oriented NAND memory cells can further include staircase regions and an array region that are formed in the second stack. The array of vertically-oriented NAND memory cells can also include channel structures formed in the array region. The channel structures can extend along a vertical direction perpendicular to the substrate and further extend through the first layers and the insulating layers in the array region. The array of vertically-oriented NAND memory cells further can have wordline contacts formed in the staircase regions. The wordline contacts can land on the first layers in the staircase regions and further extend along the vertical direction.

In some embodiments, one of the channel structures can further include a bottom channel contact positioned at a bottom of the one of the channel structures. The bottom channel contact further can extend in the substrate. The one of the channel structures can also include a blocking layer positioned along sidewalls of the one of the channel structure, where a bottom end of the blocking layer can be positioned on the bottom channel contact. The one of the channel structures can have a charge storage layer positioned along sidewalls of the blocking layer, where a bottom end of the charge storage layer can be positioned on the bottom channel contact. The one of the channel structures can have a tunneling layer positioned along sidewalls of the charge storage layer, where a bottom end of the tunneling layer is positioned on the bottom channel contact. The one of the channel structures can have a channel layer positioned along sidewalls of the tunneling layer, where the channel layer can be positioned on the bottom channel contact. The one of the channel structures further can have a top channel contact disposed on the channel layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
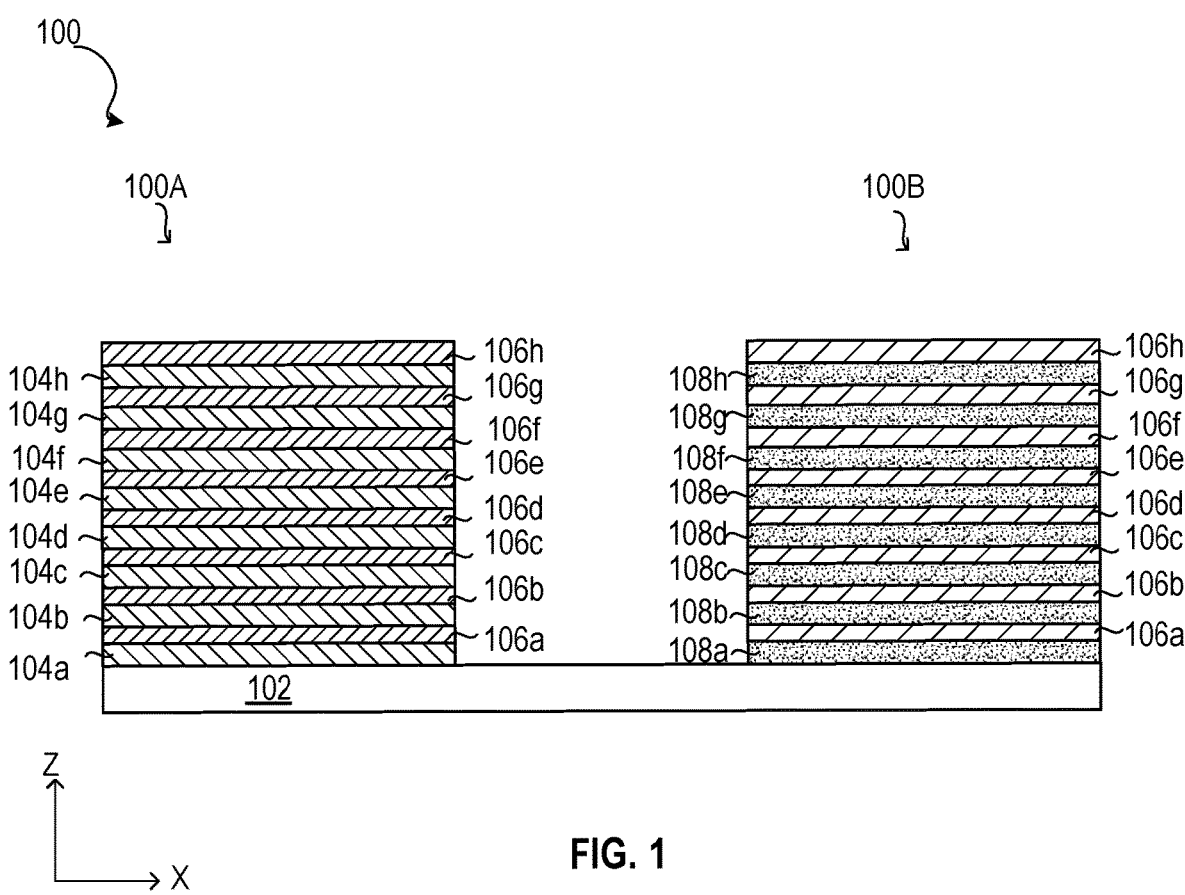
FIG. 1 is a cross-sectional view of a stack position on a substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Techniques herein enable side-by-side 3D logic and 3D memory cells made from a same initial nanosheet stack. Emerging embodiments of 3D logic, such as CFET (complementary field-effect transistor), can be formed from a first stack of alternating layers. The first stack can be formed of alternating layers of silicon (Si) and silicon-germanium (SiGe), and can be formed by an epitaxial growth. Growing from a base layer of single-crystal silicon means that the epitaxial layers can also be single crystal. Accordingly, a high-quality layer stack of up to approximately 24 individual layers can be growth. Thus, there can be two to 12 layers of Si. Note that more layers can be grown, but layer quality begins to degrade after a certain number of layers or total height of layers.

Vertical memory cells including 3D NAND memory require a second stack of layers that alternate between silicon and a dielectric. Techniques herein include converting a portion of the initial alternating Si and SiGe stack into an alternating stack of Si and dielectric. FIG. 1 shows an epitaxial stack 100 that has a first region (or logic region) 100A and a second region (or memory region) 100B formed over a substrate 102. The first region 100A can be the first stack that functions as a starting point for forming 3D logic transistors. For example, bulk silicon from a given substrate is used to grow epitaxial silicon-germanium and epitaxial silicon, which can both be single crystal orientation. The second region 100B can be the second stack used for forming the vertical memory cells. The second region 100B begins with the an epitaxial structure of the first region 100A, but then SiGe is removed and replaced with a dielectric such as an oxide. The single-crystal silicon is further doped with N-type dopants.

Still referring to FIG. 1, the first region 100A of the epitaxial stack 100 can have a plurality of first layers and second layers. For example, eight first layers 106a-106h and eight second layers 104a-104h are included in the first region 100A. In some embodiments, the first layers 106a-106h can be made of silicon and the second layers 104a-104h can be made of SiGe. The second region 100B of the epitaxial stack 100 can have a plurality of the first layers and insulating layers. For example, the eight first layers 106a-106h and eight insulating layer 108a-108h can be included the second region 100B. In some embodiments, the insulating layers 108a-108h can be formed by replacing the second layers in the second region 100B with dielectric materials, such as SiO. It should be noted that FIG. 1 is merely an example, and any number of first layers, second layers, and insulating layers can be formed in the epitaxial stack 100 according to the structures of the 3D logic transistors and the vertical memory cells.

Figure 2:
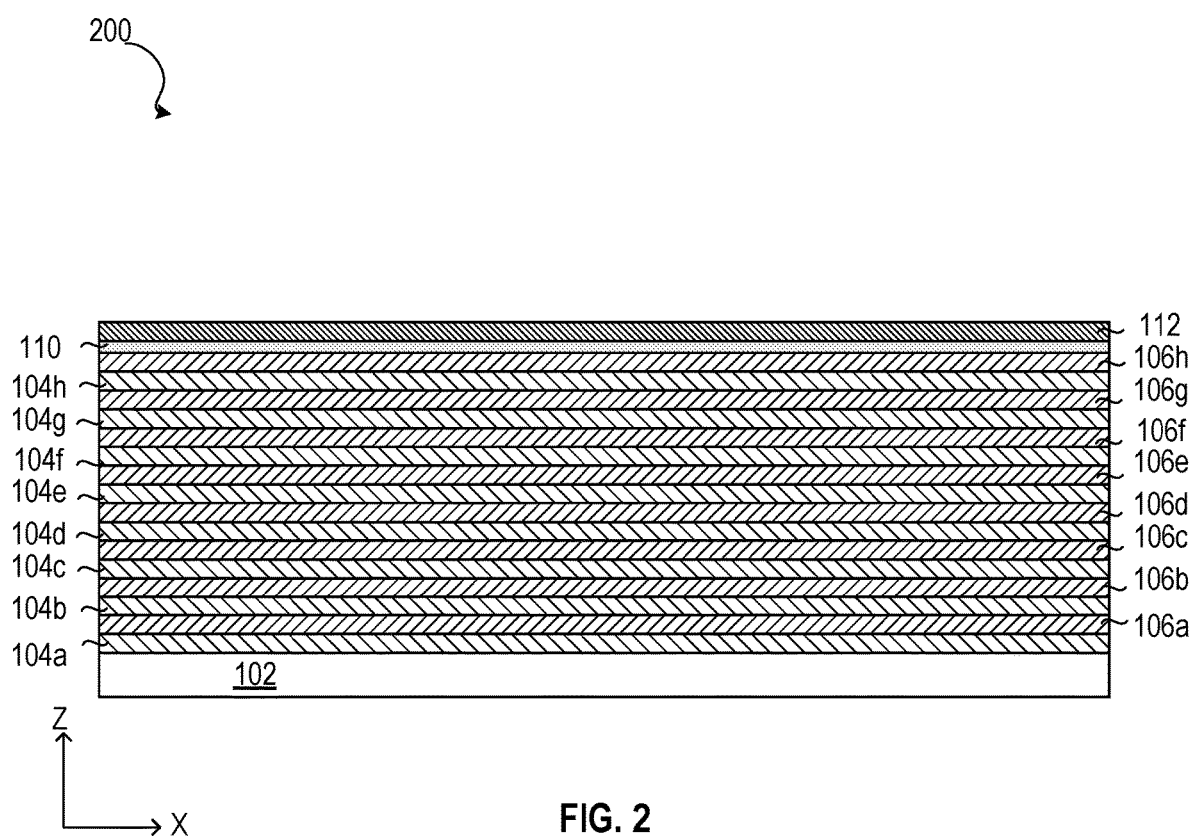
FIGS. 2, 3A, 3B, 4, 5A, 5B, 6A, 6B, 6C, 6D, 7, 8, 9, 10, 11, 12 and 13 are cross-sectional views and top down views of various exemplary intermediate steps of manufacturing the stack, in accordance with some embodiments.

FIGS. 2, 3A, 3B, 4, 5A, 5B, 6A, 6B, 6C, 6D, 7, 8, 9, 10, 11, and 12 are cross-sectional views and top down views of various exemplary intermediate steps of manufacturing the epitaxial stack, in accordance with some embodiments. A process flow can begin by forming a universal single-crystal silicon epitaxially grown nanosheet stack with alternating layers of Si/SiGe/Si/SiGe. Total number of layers is preferably at least five (at least two Si layers) and preferably less than 30. FIG. 2 illustrates an example nanosheet stack (also referred to as stack, or epitaxial stack) 200. As shown in FIG. 2, the epitaxial stack 200 can have eight Si nanoplanes (or layers) 106a-106h and eight SiGe nanoplanes (or layers) 104a-104h on a substrate 102. The Si layers 106a-106h and the SiGe layers 104a-104h can be formed by an epitaxial growth. Over the Si layers and the SiGe layers, a dielectric layer 110 and a capping layer 112 can be formed. In an exemplary embodiment of FIG. 2, the dielectric layer 110 can be made of SiO and the capping layer 112 can be made of SiN. Of course, other dielectric materials can also be applied to form the dielectric layer 110 and the capping layer 112.

Figure 3A:
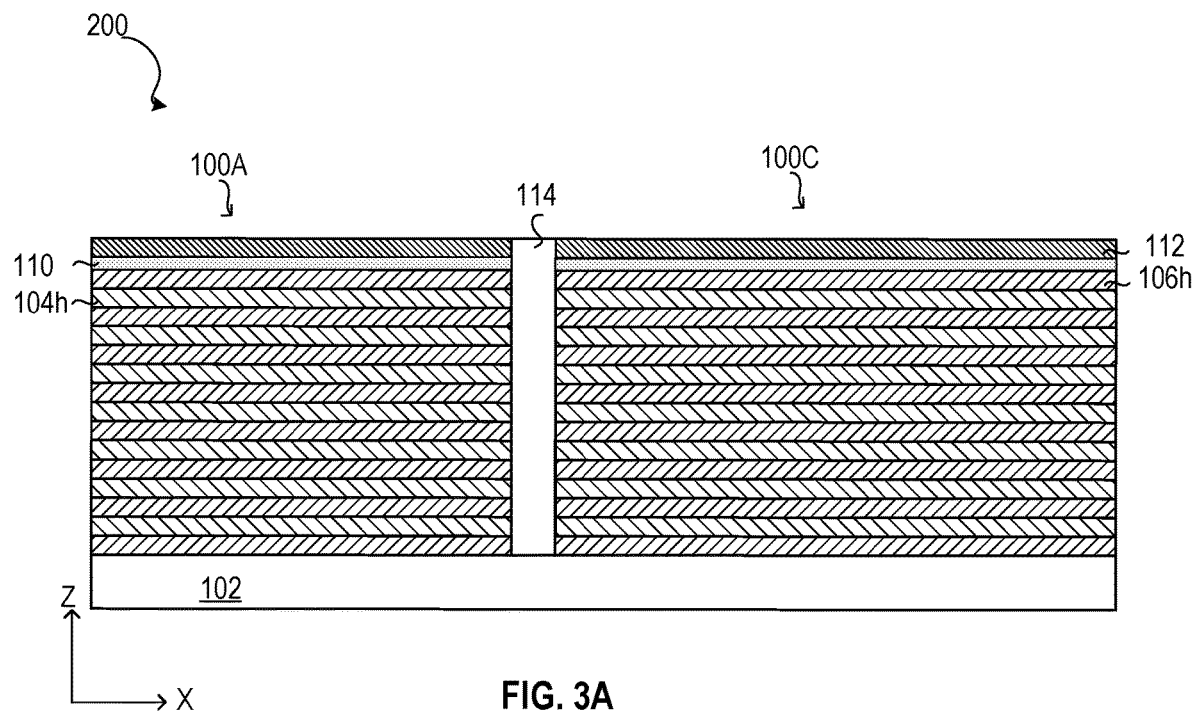
Figure 3B:
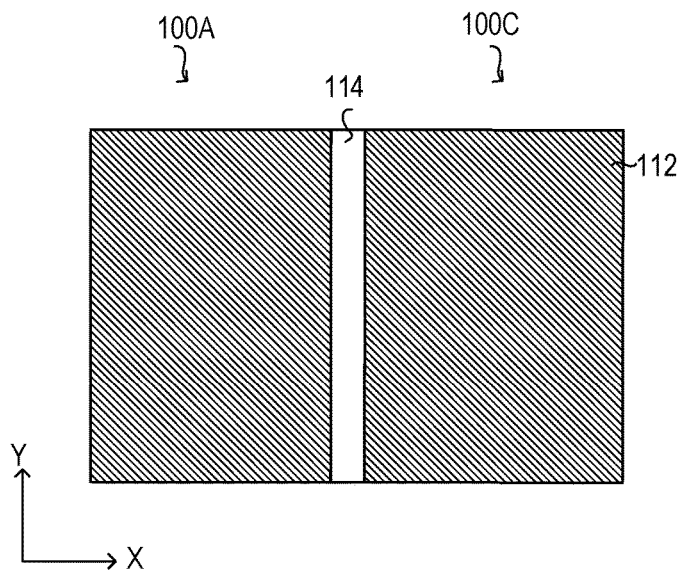

The epitaxial stack (or stack) 200 can be divided into two or more regions. FIG. 3A shows a cross-sectional view of the stack 200 that is divided into two regions, and FIG. 3B shows a top down view of the stack 200 that is divided into two regions. As shown in FIGS. 3A and 3B, the stack 200 can be divided into two regions 100A and 100C by a separation structure 114. The separation structure can extend along a first direction (e.g., Y direction) of the substrate 102. The region 100A can be a logic region that is applied for forming the 3D logic transistors, and the region 100C can be a 3D NAND region or memory region that is applied for forming the 3D NAND memory. Dividing the stack 200 can be executed using an etch mask and a directional reactive ion etch. For example, a photoresist layer (not shown) can be deposited on the epitaxial stack 200, exposed to a pattern of actinic radiation to form a latent pattern, and then developed to form a relief pattern. The relief pattern is then used as an etch mask. An anisotropic etch can etch through the epitaxial stack 200 down to the substrate 102 or an etch stop layer (not shown). The anisotropic etch can essential form trenches in the stack 200 so that the stack 200 can be separated into two regions. Thus, the Si nanoplanes (or layers) and the SiGe nanoplanes (or layers) in the stack 200 are no longer continuous. The photoresist layer can then be removed. Trenches can then be filled with a dielectric material such as oxide to form the separation structure 114. Any overburden (over fill) can be polished through a chemical-mechanic polishing (CMP) process. The capping layer 112 can be used as a CMP stop layer.

Figure 4:
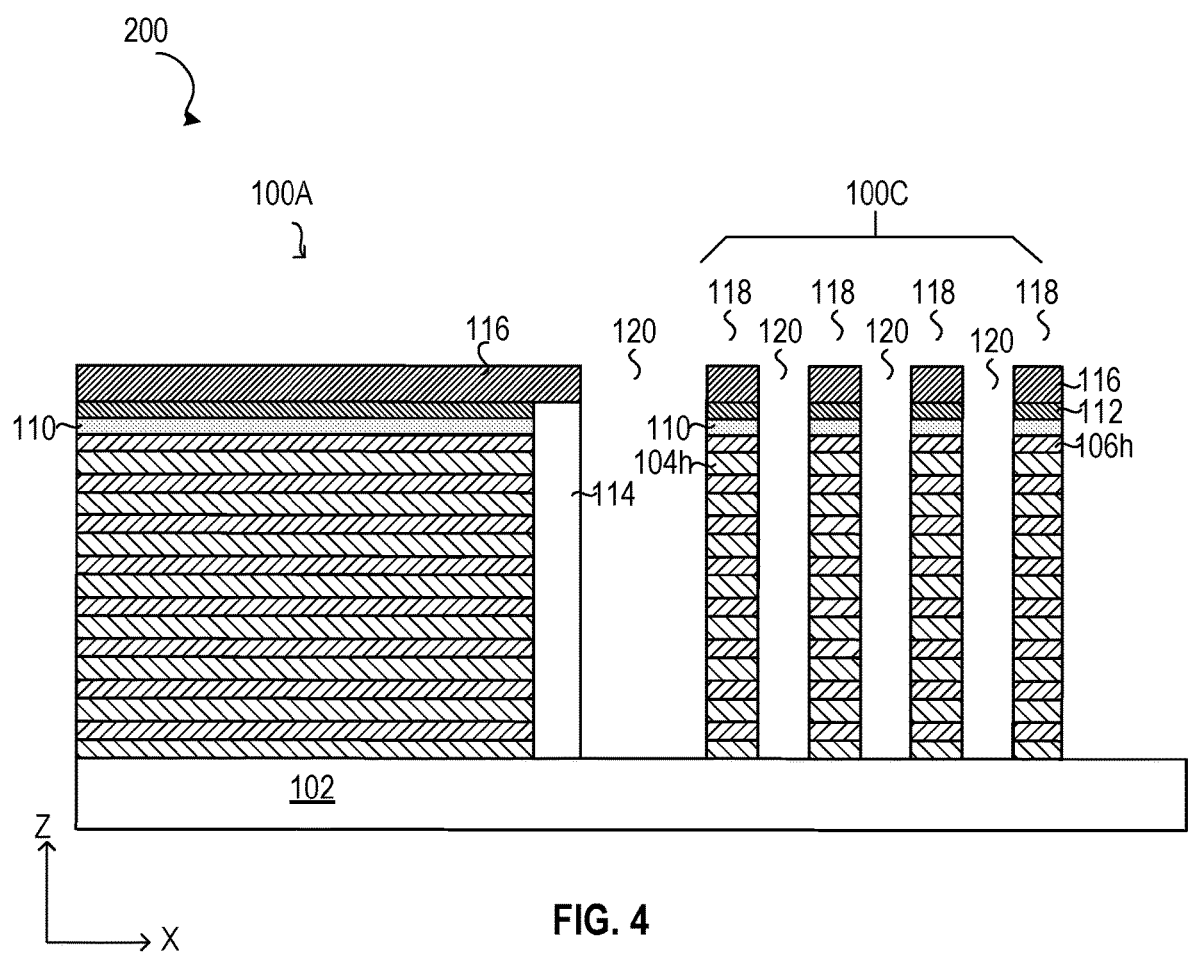

Next, in a preferred embodiment, the 3D NAND region (or memory region) 100C can be processed prior to processing the logic region 100A. FIG. 4 shows an exemplary embodiment of forming a plurality of fin structures 118 in the 3D NAND region 100C. In order to form the fin structures 118, an etch mask 116, such as a photoresist layer 116, can be formed on the capping layer 112. The etch mask 116 can protect the logic region 100A while pattern the 3D NAND region 100C with an array of lines. The etch mask 116 is then used by an etching process to etch the epitaxial stack 200 in the memory region 100C. The etching process can anisotropically etch through the nitride layer (or capping layer) 112, the oxide layer (or dielectric layer) 110, and all uncovered epitaxial nanosheets (e.g., the first layers 106 and the second layers 104) in the memory region 110C, and stop on the substrate 102 (or other etch stop layer). Note that chemistries used to etch the materials in the memory region 100C are known to persons having ordinary skill in the art. The result of the etching process is the fin structures 118 that are formed in the memory region 100C. In addition, a plurality of trenches (or openings) 120 can be positioned between the fin structures 118. The fin structures 118 can extend along the first direction (e.g., Y direction) of the substrate 102.

Figure 5A:
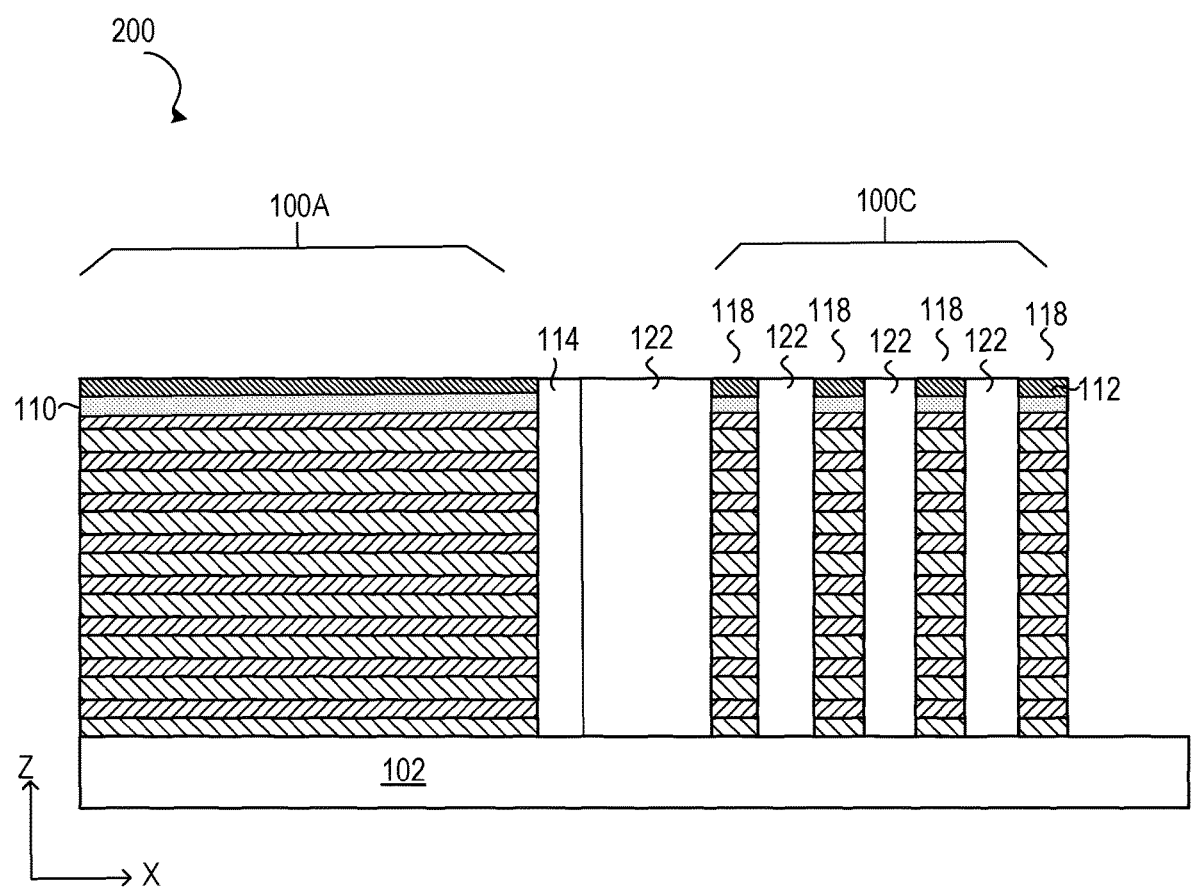
Figure 5B:
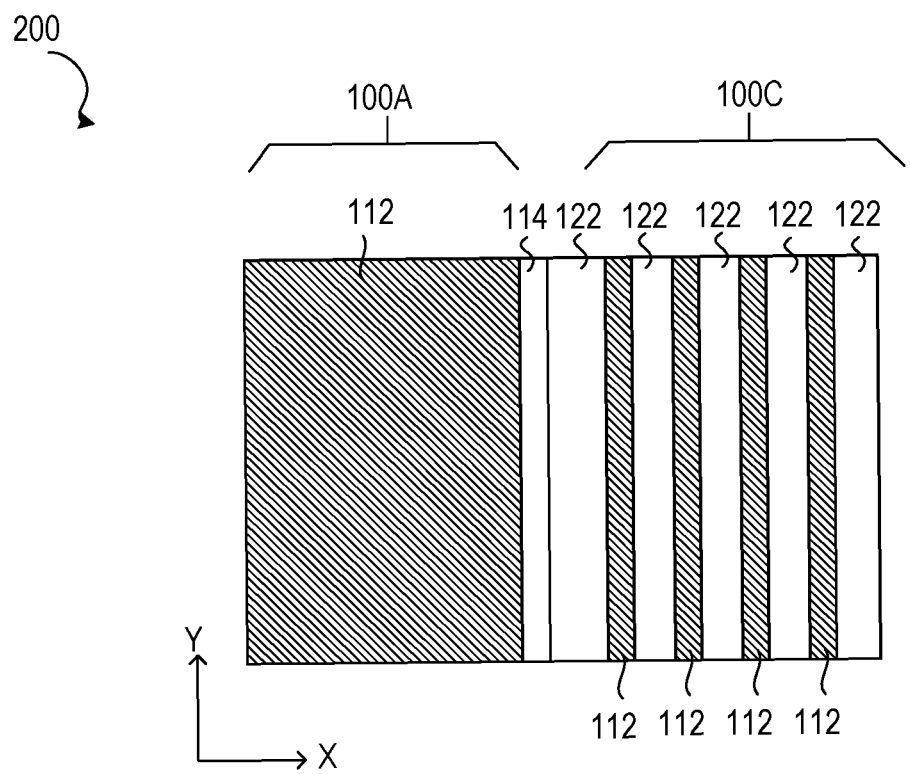

When the fin structures 118 are formed, the etch mask 116 is removed, and the openings 120 over the substrate 102 are filled with dielectric layers 122 that can be made of oxide or other suitable dielectric materials. Any overburden from the dielectric layers 122 over the capping layer 112 can then be removed by a surface planarization process, such as by a CMP process or an etch back process. An example result is illustrated in FIGS. 5A and 5B. FIG. 5A is a cross-sectional view and FIG. 5B is a top down view.

Figure 6A:
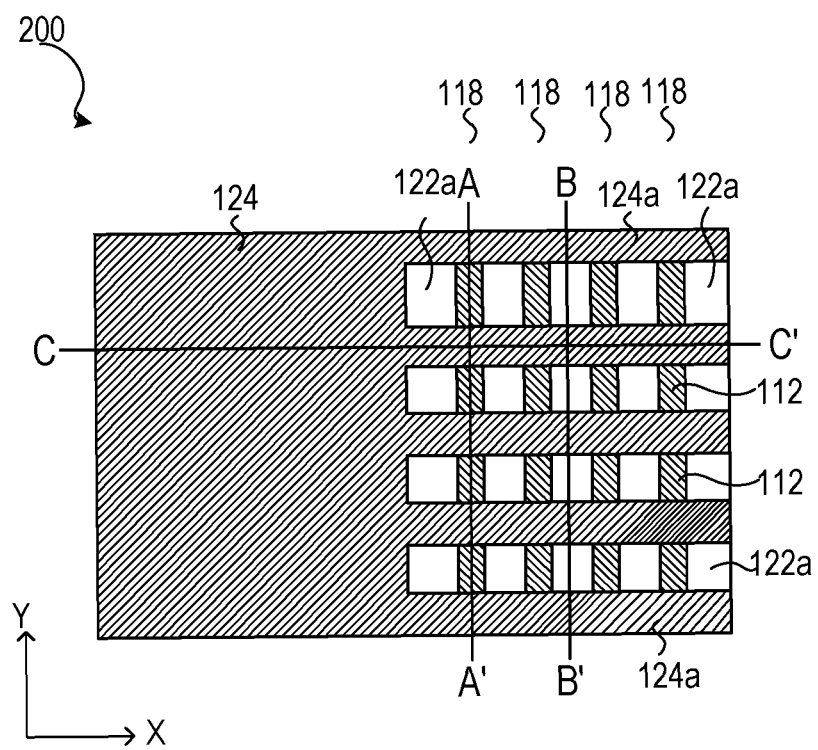

When the fin structures 118 are formed in the memory region 100C, a new etch mask can be formed over the capping layer 112 and the dielectric layers 122 in order to create first support structures for the fin structures 118. FIG. 6A illustrates a top down view of the stack 200 with an example etch mask 124 formed. The etch mask 124 can protect the logic region 100A, while in the memory region 100C form lines 124a running perpendicular to the fin structures 118 along a second direction (e.g., X direction) of the substrate 102. Note that there are cross-sectional cut lines indicated for subsequent FIGS. 6B-6D. With the etch mask 124 in place, first portions 122a of the dielectric layers 122 that are not covered by the etch mask 124 can be directionally etched down by an etching process to the substrate 102 or bulk silicon. The result of the etching process uncovers first portions of the fin structures 118 that adjacent to the first portions 122a of the dielectric layers 122. The epitaxial nanosheets (e.g., the first layers 106 and the second layers 104) on both sides of the first portions of the fin structures 118 can be uncovered accordingly. Further, the etch mask 124 preserves second portions of dielectric layers 122 that are covered by the etch mask 124, and the second portion of the dielectric layers 122 can function as the first support structures 126.

Figure 6B:
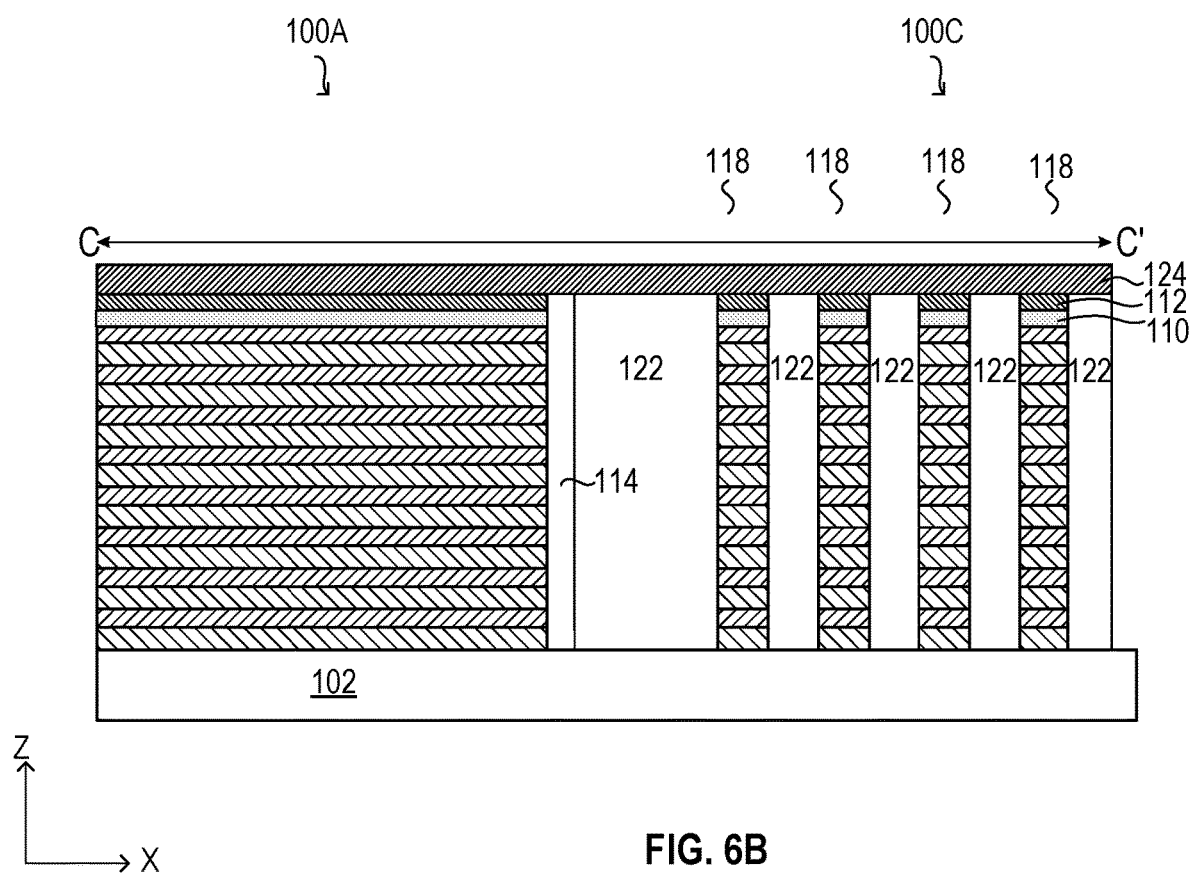

FIG. 6B shows a cross-sectional view along a line CC' that is illustrated in FIG. 6A, which cuts through the etch mask 124. Note that the dielectric layers 122 are still in place around fin structures 118.

Figure 6C:
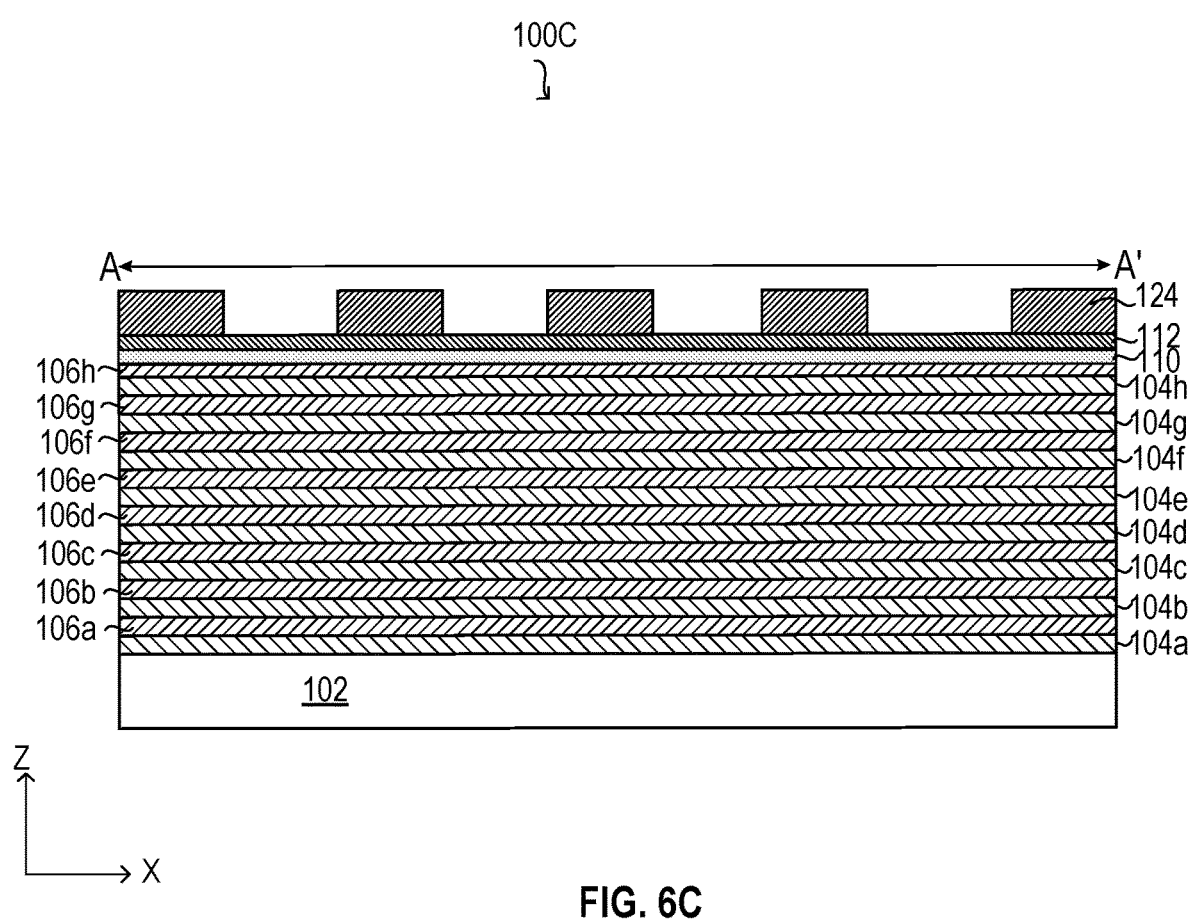

FIG. 6C shows a cross-sectional view along a line AA' that is illustrated in FIG. 6A. The cross-sectional view obtained along the line AA' extends through a fin structure 118 so that the alternating first layers 106 and second layers 104 are visible.

Figure 6D:
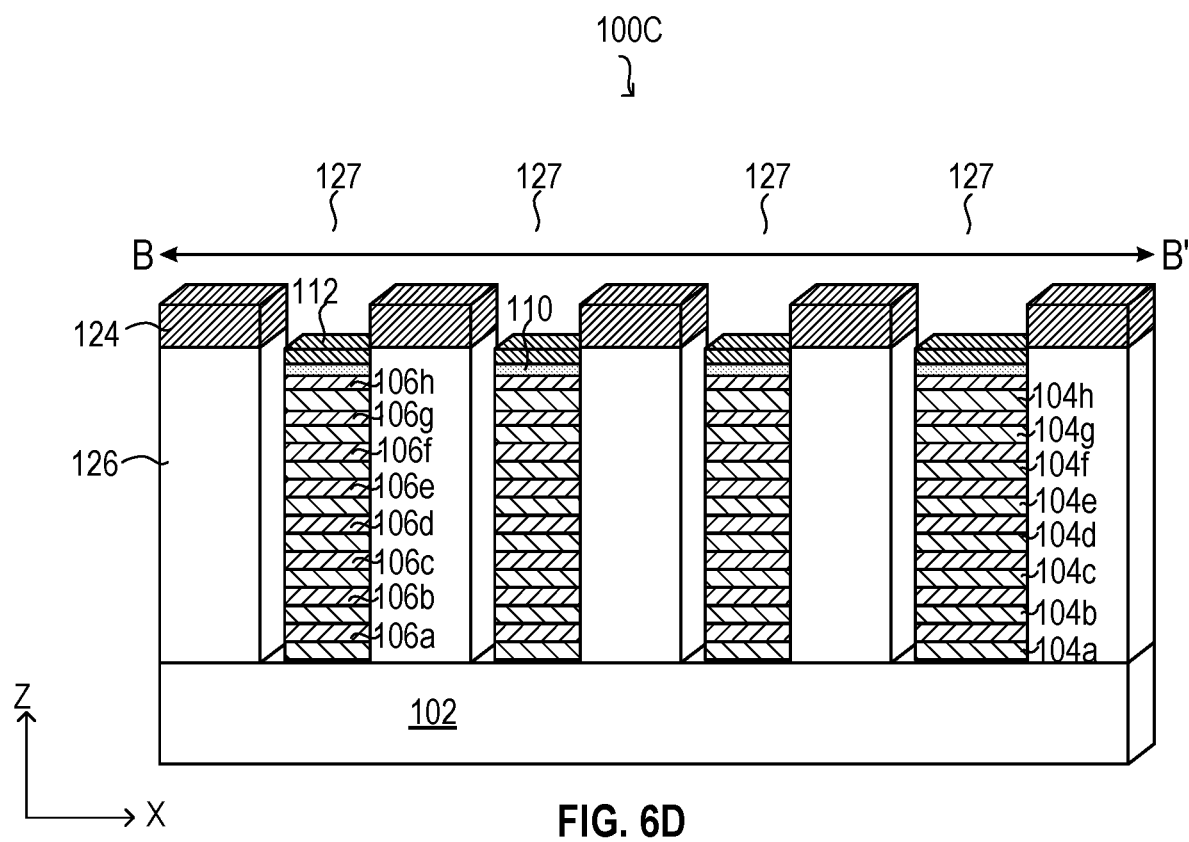

FIG. 6D shows a perspective view along a line BB' after the first portions 122a of the dielectric layers 122 are etched away. As shown in FIG. 6D, the first portions 122a of the dielectric layers 122 positioned between the lines 124a of the etch mask 124 that extends through the memory region 100C have been removed from the fin structures 118 to form a plurality of openings 127. Accordingly, the first portions of the fin structures 118 adjacent to the removed first portions 122a of the dielectric layer 122 are uncovered in the openings 127, and the first layers 106 and second layers 104 on sidewalls of the first portions of the fin structures 118 are uncovered or exposed and accessible to an isotropic etching. The second portions of the dielectric layers 122 covered by the etch mask 124 can have a pillar-shape and be arranged alternatingly with the uncovered first portions of the fin structures 118 that are positioned in the openings 127 to function as the first support structures 126.

Figure 7:
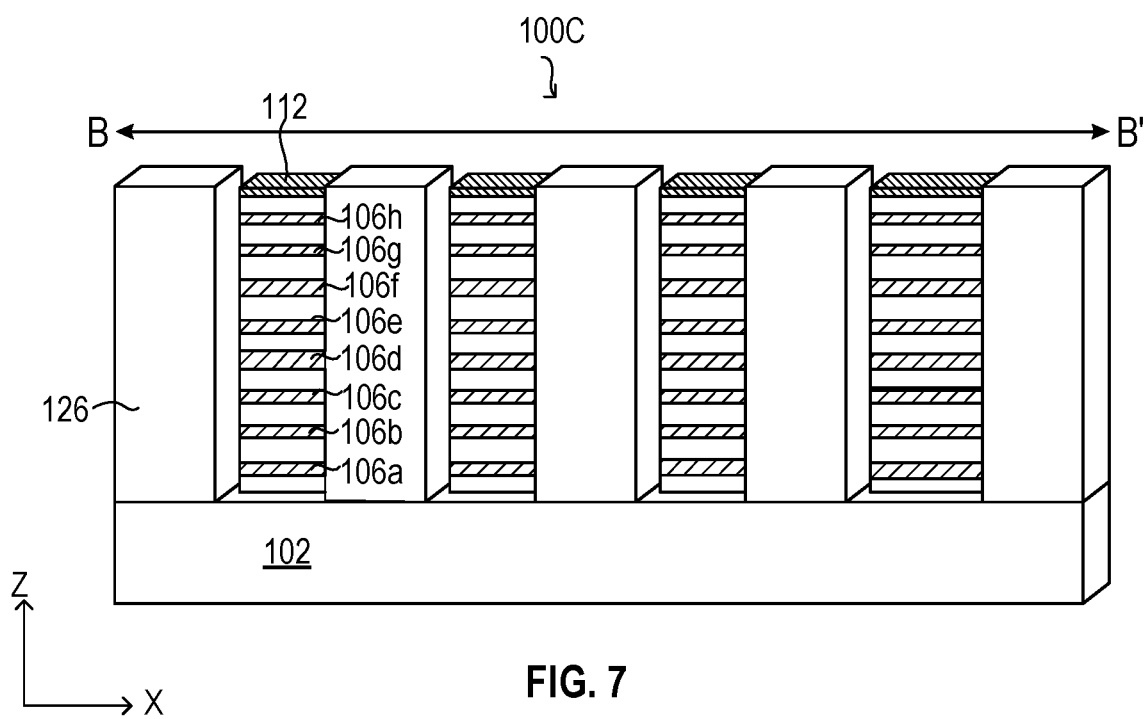

The etch mask 124 can be removed subsequently. Further, the second layers 104 in the first portions of the fin structures 118 can be removed. Removal of the second layers 104 in the first portions of the fin structures 118 can be accomplished by an isotropic etching process. The isotropic etching process can be a vapor phase etching process, and can be highly selective to the second layers 104 relative to the first layers 106. In some embodiments, the isotropic etching process can also etch away first portions of the dielectric layer 110 in the first portions of the fin structures 118. Note that the second portions of the second layers 104 remains within the first support structures 126. The second portions of the second layers 104 in the first support structures 126 can be removed in a subsequent step. The remaining oxide pillars (e.g., the first support structures 126) enable the fin structure 118 to be supported after the removal of the second layers 104 in the first portions of the fin structures 118 with no length restrictions. FIG. 7 shows an example result along line BB' where the second layers 104 in the first portions of the fin structures 118 are removed by the isotropic etching process.

Figure 8:
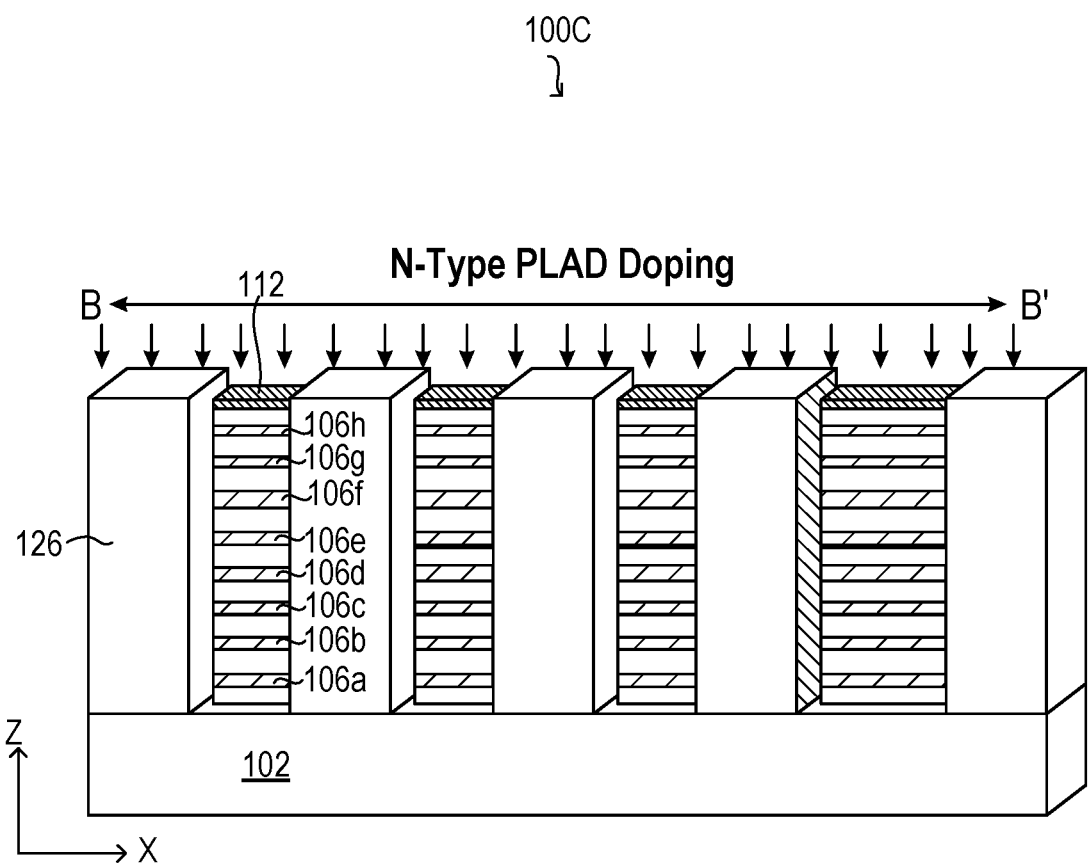

Once the second layers 104 in the first portions of the fin structures 118 are removed, the first layers 106 in the first portions of the fin structures 118 can be doped by a doping process. For example, an N-type PLAD (plasma doping) process can be applied, and the N-type dopant can be As or P with a dopant level from 5E15 to 1E16 Ion/cm$^2$, where a doping energy can be from 1 to 5 KeV. Note that the second portions of the second layers 104 remains within the first support structures 126 during the doping process so that the nanosheets (e.g., the first layers 106 and second layers 104) in the fin structures 118 can be supported with no length restrictions. FIG. 8 illustrates an example result of the doping process along BB'.

Figure 9:
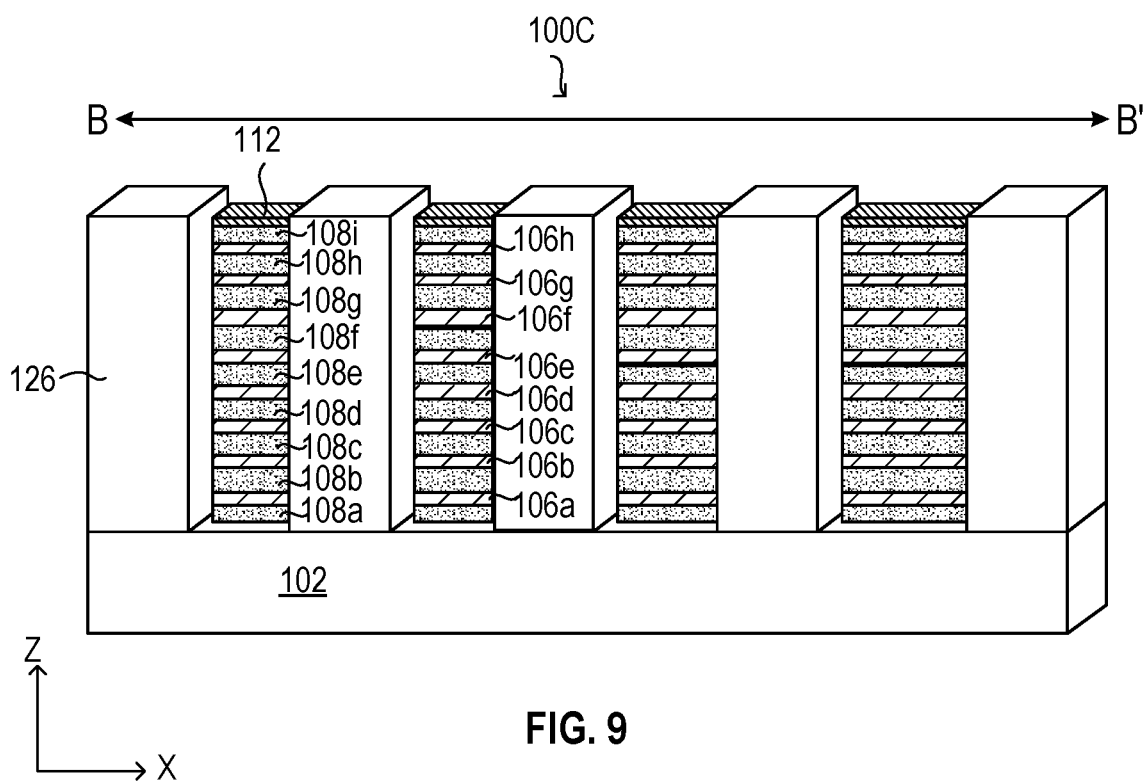

After the second layers 104 in the first portions of the fin structures 118 are removed and first layers 106 in the first portions of the fin structures 118 are doped, a dielectric material, such as an oxide, can be filled in gaps between the first layers 106 in the first portions of the fin structures 118. The filling of the dielectric material can be can be accomplished by an epitaxial growth process, a chemical vapor deposition (CVD) process, an atomic layer deposition (ALD) process, or other suitable deposition processes. A surface planarization process, such as a CMP process, can be optionally executed after to remove excess dielectric material over the capping layer 112, and the dielectric material that remains in the gaps between the first layers 106 becomes the insulating layers 108. FIG. 9 shows an example result along line BB'. It should be noted that only the memory region 100C is shown in FIG. 9. Further, it should be noted that the second layers 104 still remain in the first support structures 126.

After the first portions of the second layers 104 are removed and replaced with insulating layers 108 in the first portions of the fin structures 118, the first support structures 126 can be removed to access the second portions of the fin structures 118 that were protected by the first support structures 126, and second support structures 130 can be formed at the openings 127 to protect the first portions of the fin structures 118. In order to form the second support structures 130, a dielectric (e.g., oxide) deposition can be applied to fill the openings 127 on the substrate 102. A surface planarization process can be subsequently applied to remove any excess dielectric over the capping layer 112 so that the dielectric remains in the openings 127 becomes the second support structures 130. Further, an etch mask 128 can be formed over the capping layer 112. The etch mask 128 can have lines (not shown) that are offset from previous lines 124a. The lines of the etch mask 128 can cover the first portions of the fin structures 118 and the second support structures 130 deposited in the openings 127, and uncover the second portions of the fin structures 118 and the second portions of the dielectric layers 122 that are adjacent to the second portions of the fin structures 118. The etch mask 128 essentially defines lines for protect the second support structures 130 at locations adjacent to the first portions of the fin structures 118, where the second layers 104 has been replaced with the insulating layers 108 and the first layers 106 has been doped. The second portions of the dielectric layers 122 can then be directionally etched away by an etching process using the etch mask 128 so that the second support structures 130 remain. It should be noted that the second portions of the fin structures 118 are unaffected during the etching process because of the protection of the capping layer 112.

Figure 10:
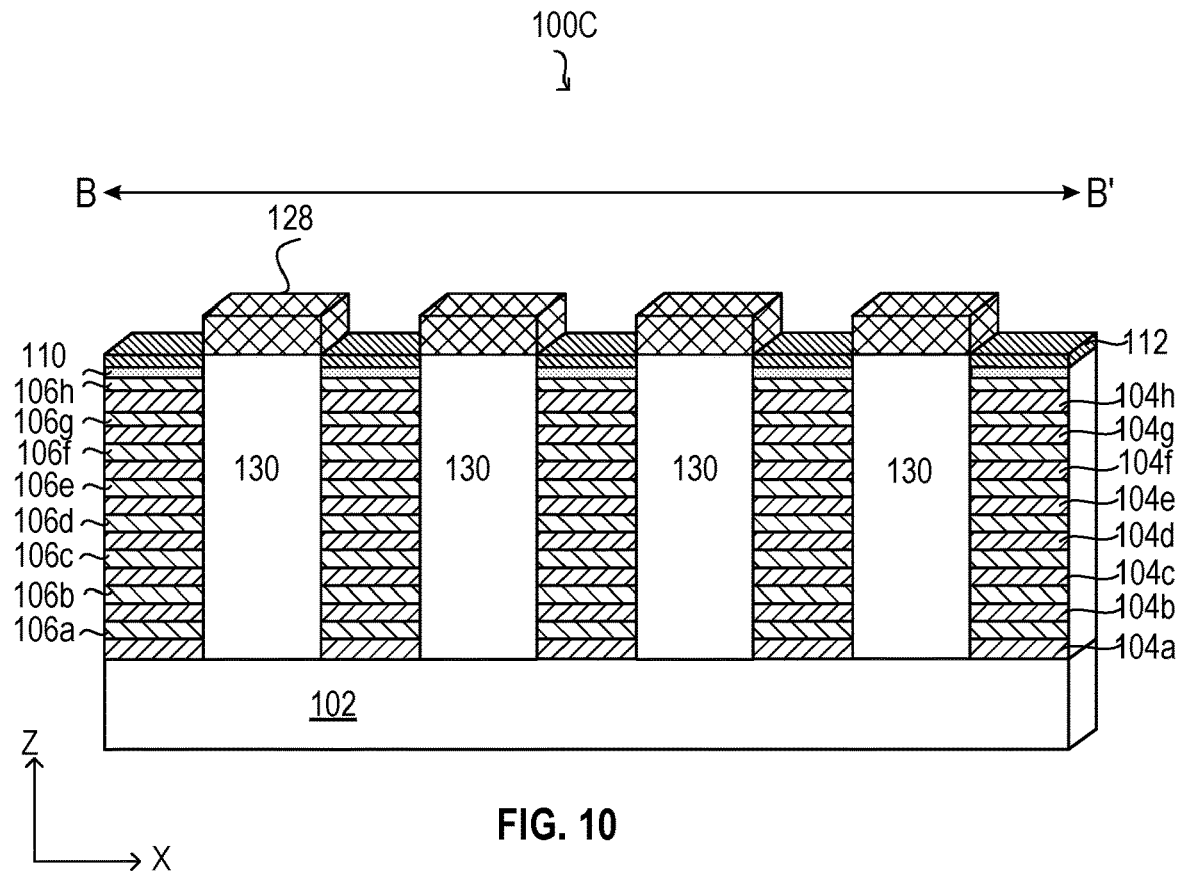

FIG. 10 shows an exemplary embodiment of removing the first support structures 126 and forming the second support structures 130. As shown in FIG. 10, the previously-covered first layers 106 and second layers 104 in the second portions of the fin structures 118 are now uncovered, while the first layers 106 and the insulating layers 108 in the first portions of the fin structures 118 are now covered by the second support structures 130. Note that the capping layer 112 can function as a self-aligned mask to precisely define edges for the second layers 104 in the second portions of the fin structures 118 that need to be replaced with a dielectric material in subsequent steps.

Figure 11:
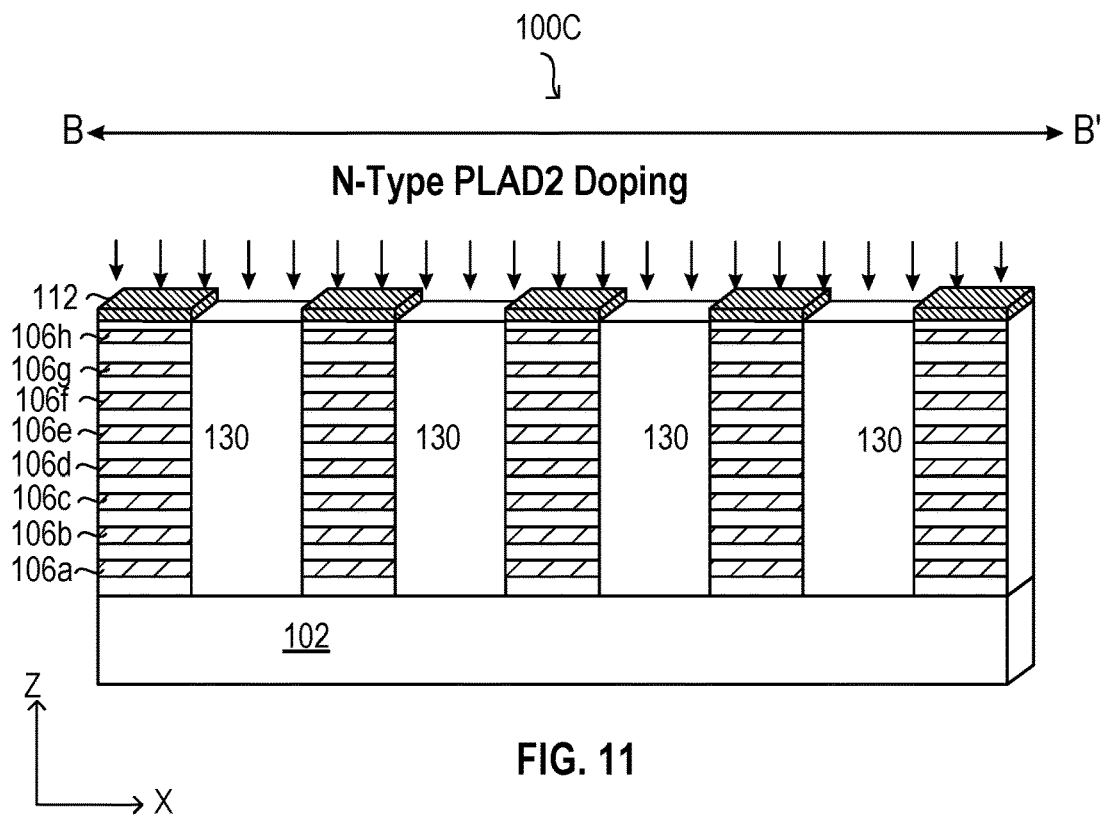

With the previously-covered first layers 106 and second layers 104 in the second portions of the fin structures 118 are now uncovered, processing can continue as described previously. The second layers 104 in the second portions of the fin structures 118 can be removed via an isotropic etching process to forming gaps between the first layers 106. In some embodiments, the second portions of the dielectric layer 110 in the second portions of the fin structures 118 can also be removed by the isotropic etching process. The removal of the second layers 104 can be followed by a plasma implant process, where the first layers 106 can be doped by a N-type dopant, such as As or P, with a dopant level from 5E15 to 1E16 Ion/cm$^2$ under an implantation energy from 1 to 5 KeV. FIG. 11 illustrates an example result of the removal of the second layers 104 and the implantation process applied on the first layers 106 in the second portions of the fin structures 118.

Figure 12:
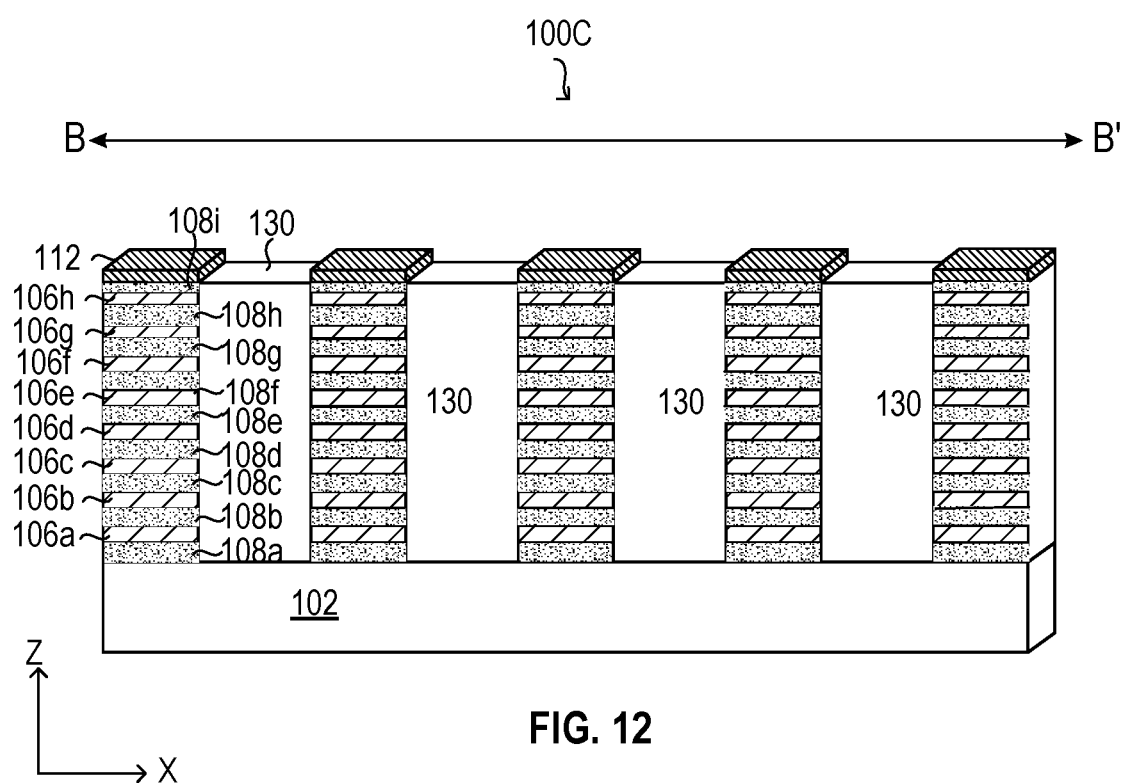

Subsequent to the plasma implant process, a dielectric material, such as an oxide, can be filled in gaps between the first layers 106 in the second portions of the fin structures 118. The filling of the dielectric material can be accomplished by an epitaxial growth process, a chemical vapor deposition (CVD) process, an atomic layer deposition (ALD) process, or other suitable deposition processes. A surface planarization process, such as a CMP process, can be optionally executed after to remove excess dielectric material over the capping layer 112, and the dielectric material that remains in the gaps between the first layers 106 becomes the insulating layers 108. FIG. 12 shows an exemplary embodiment of forming the insulating layers 108 in the second portions of the fin structures 118.

Figure 13:
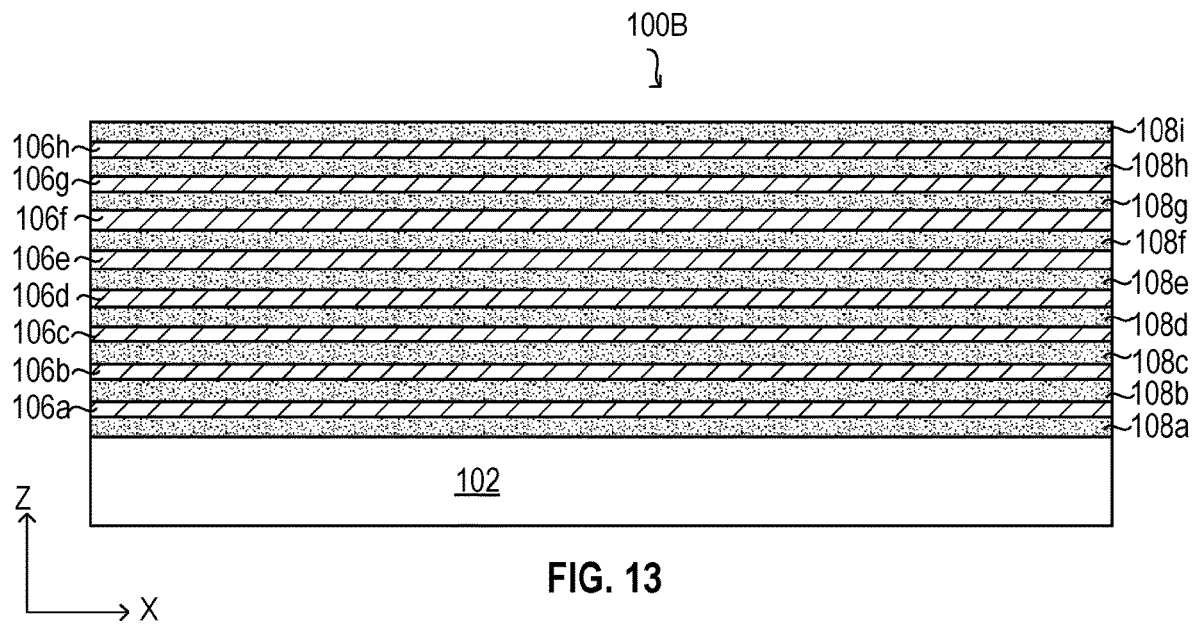

In FIG. 13, the capping layers 112 and the second support structures 130 can be removed by an etching process. When the capping layer 112 and the second support structures 130 are removed, the memory region 100C becomes the memory region 100B that has a similar configuration to the 100B in FIG. 1. It should be noted that the logic region (or the first region) 100A still remains on the substrate 102.

Figure 14:
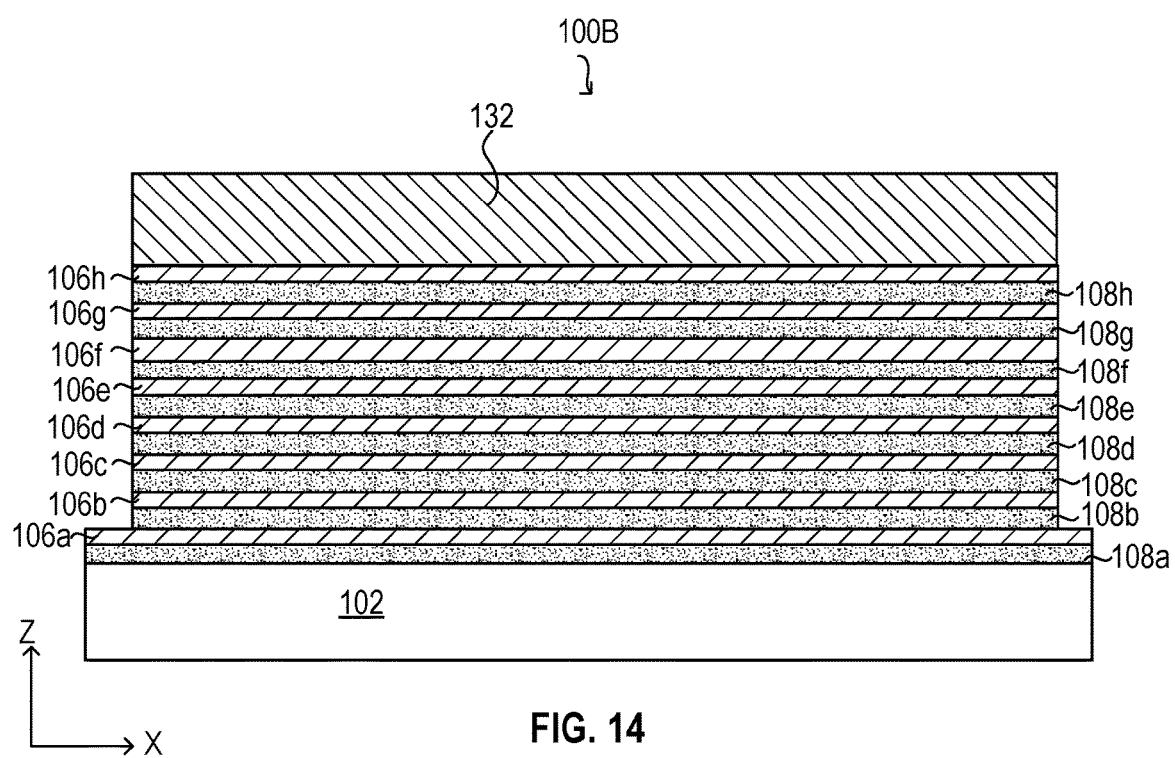
FIGS. 14-21 are cross-sectional views of various exemplary intermediate steps of manufacturing a three-dimensional (3D) NAND memory device in the stack, in accordance with some embodiments.
Figure 15:
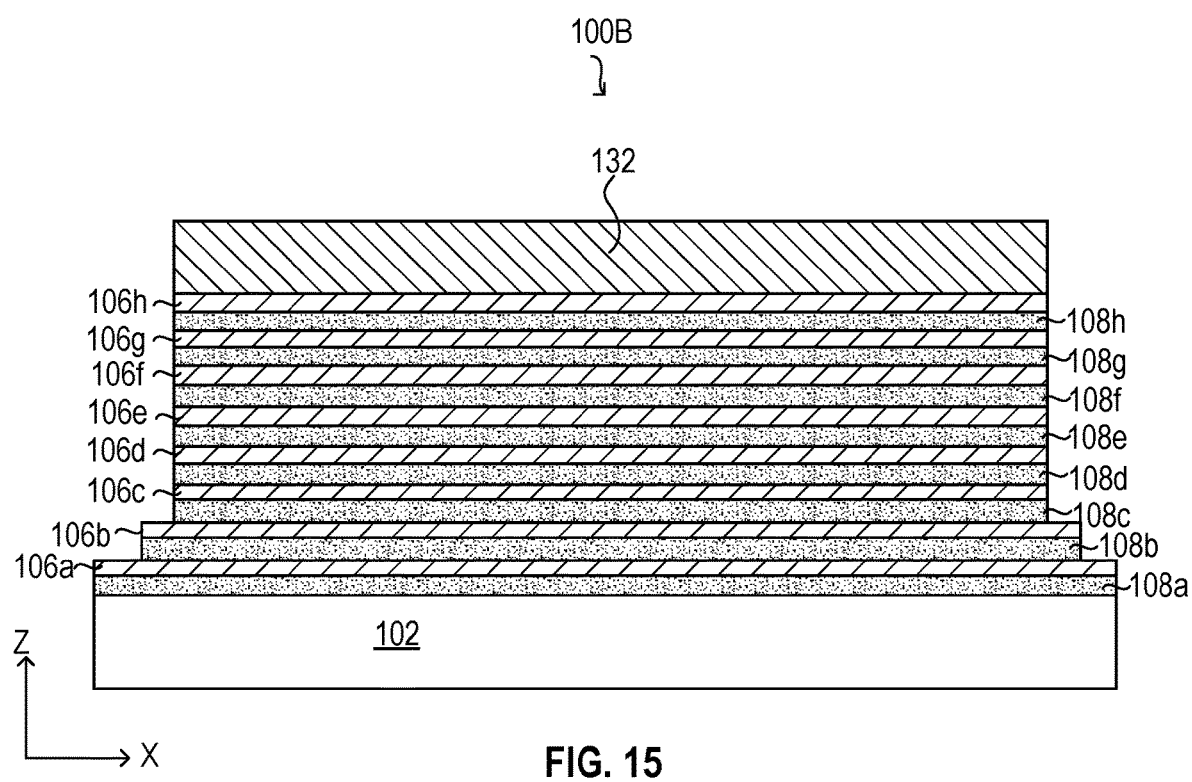

FIGS. 14-21 are cross-sectional views of various exemplary intermediate steps of manufacturing a three-dimensional (3D) NAND memory in the memory region 100B, in accordance with some embodiments. In FIG. 14, a trim-etch process for forming the wordlines is executed. Note that the formation of the wordlines can follow conventional 3D NAND processes. For example, in the trim-etch process, a photoresist etch mask 132 can be patterned over an uppermost first layer 106h, and then an etching process can etch the memory region 100B toward the substrate 102 to uncover a lowermost first layer 106a. In FIG. 15, the etch mask 132 is laterally trimmed and then the etch process is executed again to uncover a second-from-bottom first layer 106b. Note that just one photoresist mask (e.g., etch mask 132) can be used to uncover all first layers following the sequence of trim and etch process.

Figure 16:
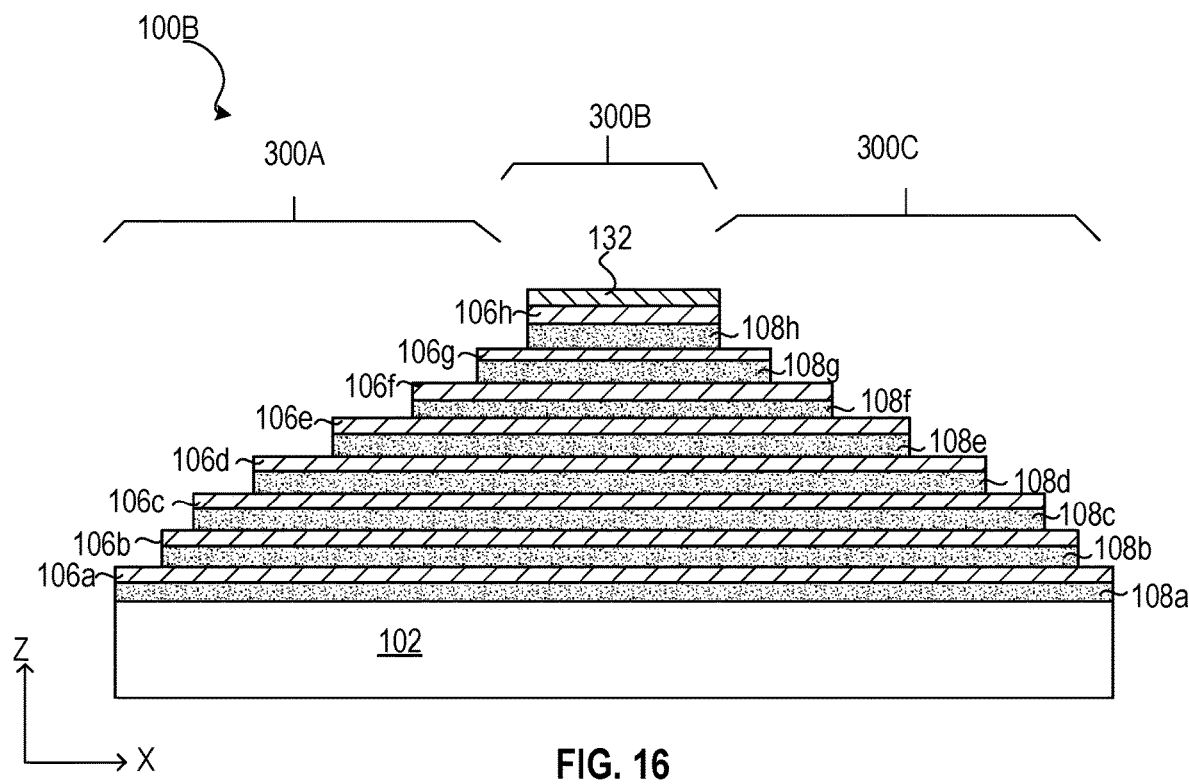

The stair etching technique (e.g., the trim-etch process) is repeated until reaching the uppermost first layer 106h, as shown in FIG. 16. When the trim-etch process is completed to reach the uppermost first layer 106h, staircase regions 300A and 300C, and an array region 300B can be formed in the memory region 100B. As shown in FIG. 16, the array region 300B is disposed between the staircase regions 300A and 300B. In the staircase regions 300A and 300C, the first layers 106 are arranged in a staircase configuration and function as wordlines 106 of a 3D NAND memory. In the array region 300B, the first layers 106 can function as gate electrodes (or control gates) of the 3D NAND memory. In FIG. 16, eight wordlines (or first layers) 106 are provided. However, it should be noted that FIG. 16 is merely an example, and any number of wordlines can be included in the memory region 100B according to the structure of the 3D NAND memory.

Figure 17:
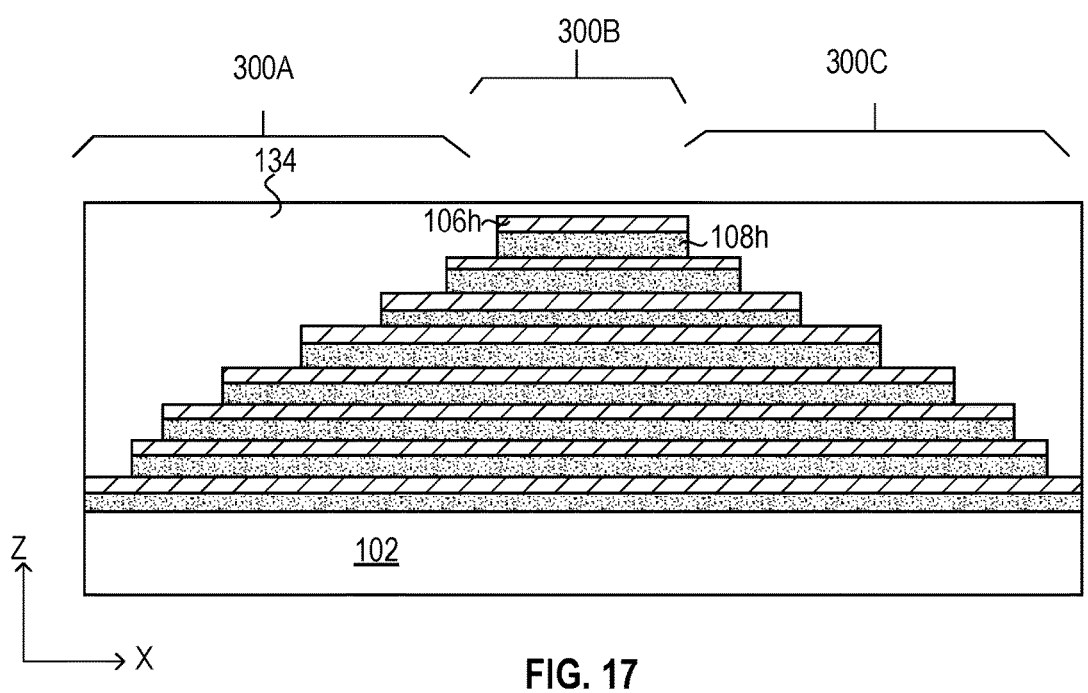

When the wordlines (or first layers) 106 are formed in the staircase regions 300A and 300C, remaining photoresist etch mask 132 can be removed. Then an oxide deposition step can be applied to fill the substrate 102 up to the uppermost first layer (or uppermost wordline) 106h at least. Oxide overburden can be polished subsequently. FIG. 17 shows an example result of the oxide deposition and the oxide overburden polishing. When the oxide overburden is completed, a dielectric layer 134 can be formed, where the dielectric layer 134 covers the staircase regions 300A and 300C. The dielectric layer 134 can further cover the array region 300B.

Figure 18:
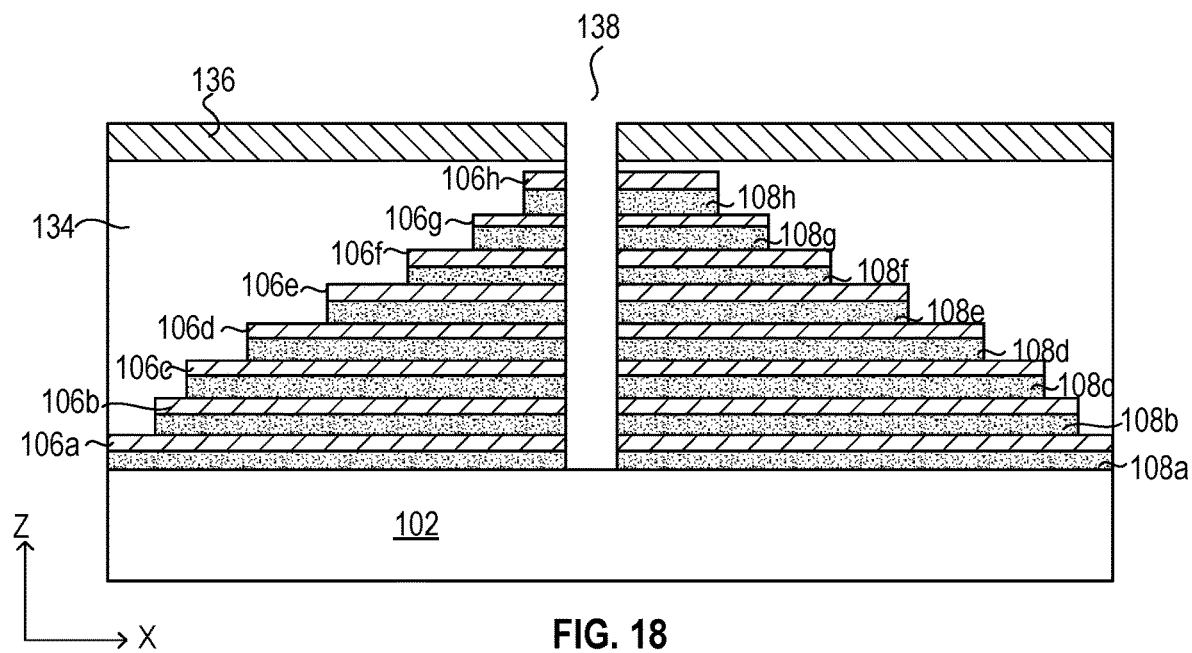

In FIG. 18, an etch mask 136 can be formed to define a 3D memory bit etch down to substrate 102 so that the 3D memory bit etch can form channel openings. The channel openings can extend through the wordlines (or first layers) 106 and the insulating layers 108, and further expose the substrate 102. For simplicity and clarity, a channel opening 138 can be illustrated in FIG. 18. In some embodiments, in order to form the channel opening 138, a self-aligned double/multi-patterning technique can be used to define a minimum opening.

Figure 19:
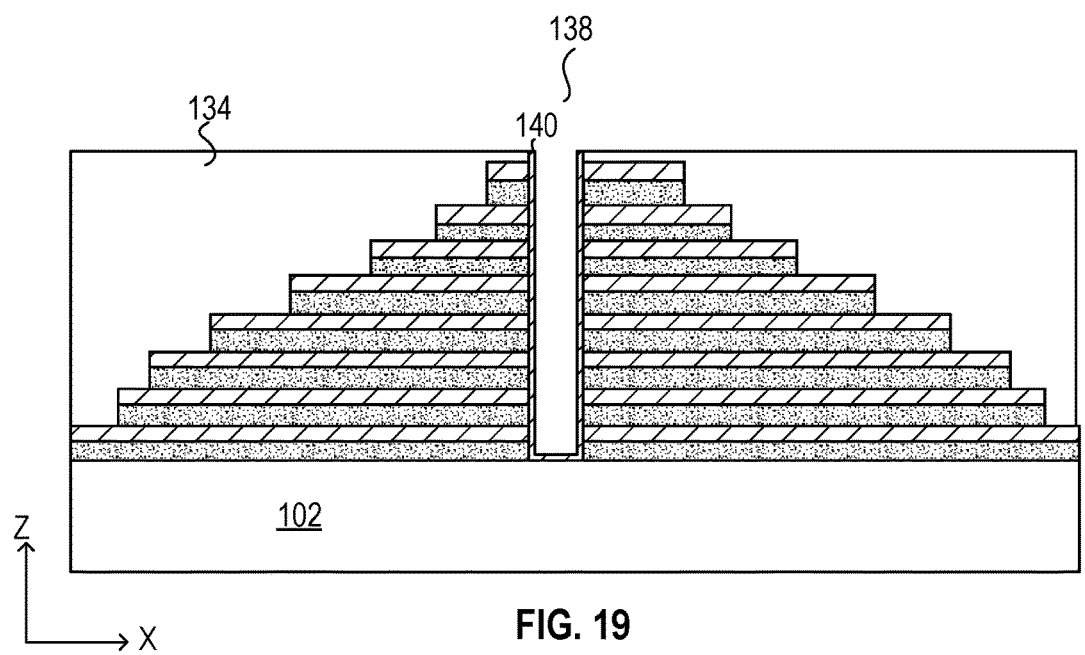
Figure 20:
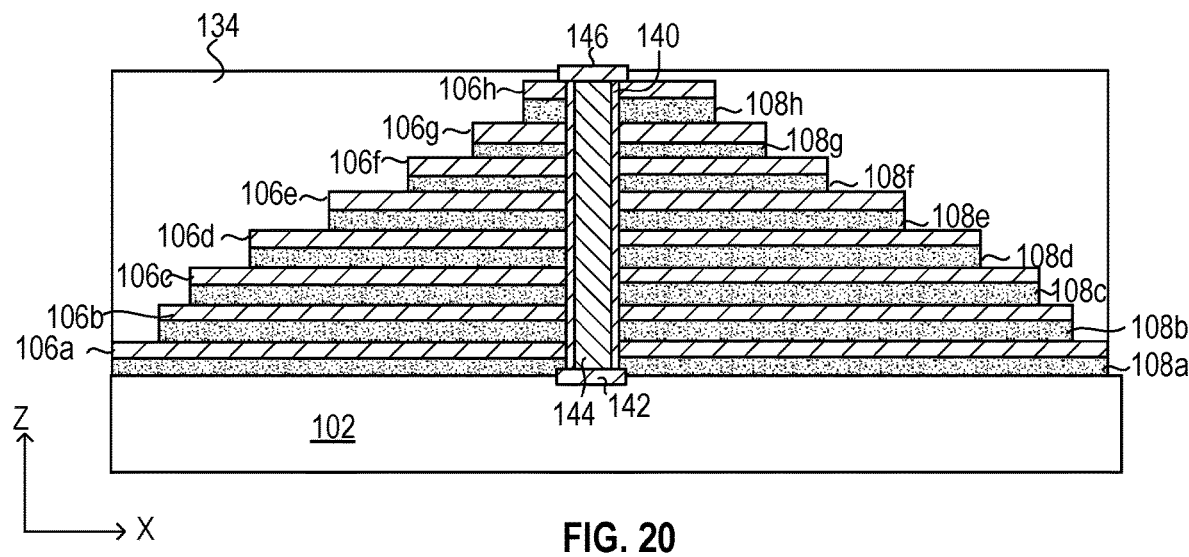

The etch mask 136 can be removed and a charge trap layer 140 can be grown along sidewalls and a bottom of the channel opening 138. In some embodiments, the charge trap layer 140 can include first oxide/nitride/second oxide (or first dielectric/charge storage layer/first dielectric). The first oxide can function as a blocking layer positioned along the sidewalls of the channel opening 138, the nitride can function as a charge storage layer positioned over the blocking layer, and the second oxide can function as a tunneling layer positioned over the charge storage layer. However, many different charge trapping combinations are available in the present disclosure. FIG. 19 illustrates an example result of forming the charge trap layer 140 that covers the bottom and the sidewalls of the channel opening 138.

An etch process can subsequently be applied to remove the charge trap layer 140 at the bottom of the channel opening 138, thereby uncovering the substrate 102. An epitaxial growth process can be used to fill the channel opening 138. The epitaxial growth process can form a bottom channel contact (or source contact) 142 that is positioned at the bottom of the channel opening and further extends into the substrate 102. The bottom channel contact 142 can have N+ dopants and be configured to connect to the substrate 102. The epitaxial growth process can also form a channel layer 144 that is arranged along sidewalls of the charge trap layer 140 and positioned over the bottom channel contact 142. The channel layer 144 can have N+ dopants and can further be positioned on the bottom channel contact 142. The epitaxial growth process can further form a top channel contact 146 that is positioned on the channel layer 144. The top channel contact 146 is configured to connect to a bitline (BL) in subsequent manufacturing steps.

Figure 21:
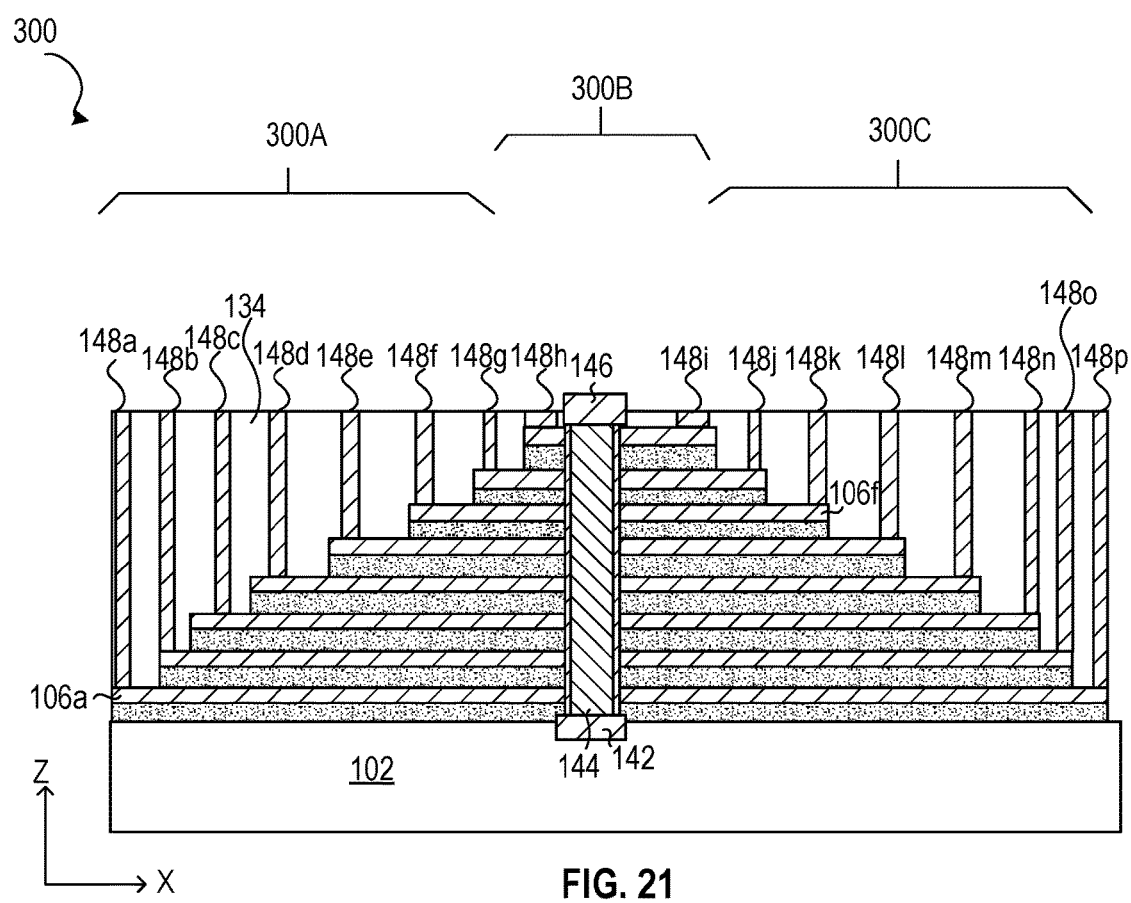

Next, a mask (not shown) can be formed for a bitline etching to form a bitline over the top channel contact 146. Another mask (not shown) can be used for wordline (also referred to control gate (CG)) etching to form a plurality of Via openings (not shown). The Via openings can extend through the dielectric layer 134 and land on the wordlines 106 in the staircase regions 300A and 300C so that the wordlines (or first layers) 106 can be uncovered by the Vias openings. The Via openings can further be filled with a conductive material, such as W, Co, Ru, Al, or Cu. A surface planarization can be applied to remove excess conductive material over the dielectric layer 134. The conductive material that remains in the Via openings becomes wordline contacts in the staircase regions 300A and 300C. FIG. 21 shows an example result of the formation of the wordline contacts 148a-148p. As shown in FIG. 21, the wordline contacts 148 are positioned on the wordlines 106 to connect to the wordlines 106 in the in the staircase regions 300A and 300C. When the wordline contacts 148 are formed, a 3D NAND memory 300 is formed over the substrate 102.

Figure 22:
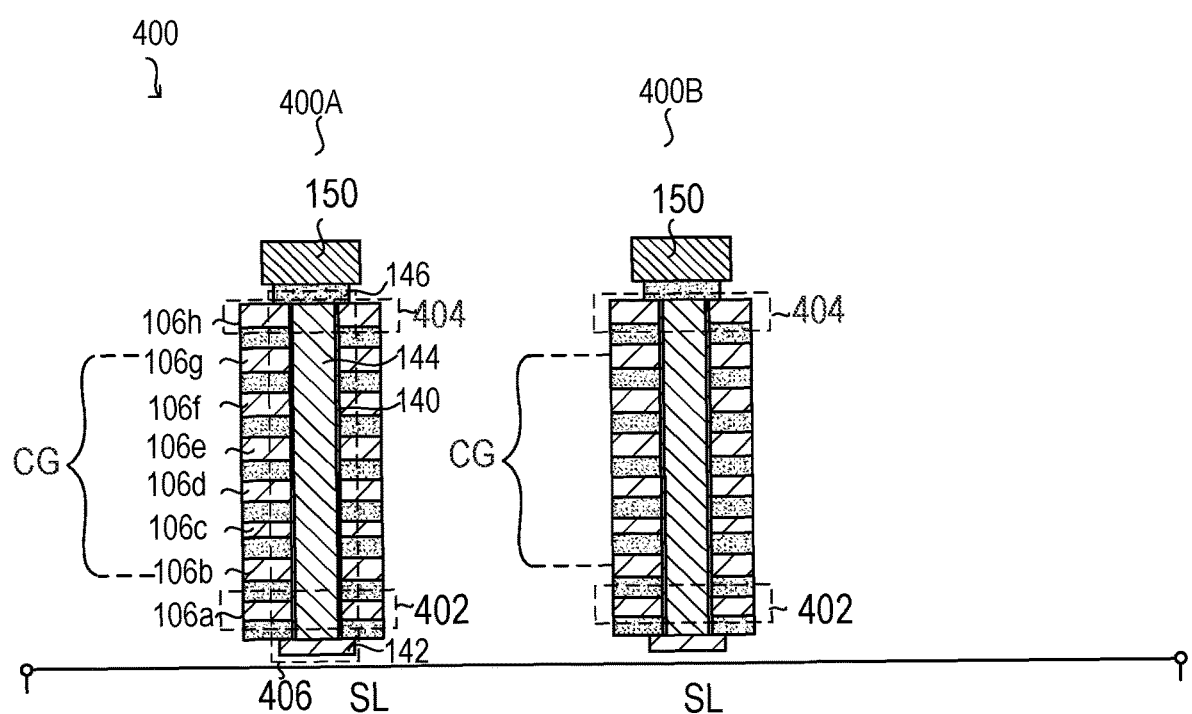
FIG. 22 is a schematic view of the 3D NAND memory device, in accordance with some embodiments.

FIG. 22 shows a 3D single stack NAND memory 400 (also referred to 3D NAND memory 400) that include one or more epitaxial grown vertical channel structures that are coupled to the wordlines to form vertical memory cell strings. In a 3D NAND device, channel structures and wordlines are coupled to each other to form vertical NAND memory cell strings. Each of the vertical NAND memory cell strings can have a source contact, a select gate source (SGS) transistor, a plurality of memory cells (MCs), a select gate drain (SGD) transistor, and a bitline that are disposed sequentially and in series over a substrate along a third direction (or Z direction) of the substrate. Each of the vertical NAND memory cell strings can be formed of a channel structure and the wordlines (WLs) that surrounds the channel structure. As shown in FIG. 22, two vertical NAND memory cell strings (or strings) 400A and 400B are included in the 3D NAND memory 400 that can be formed in the memory region 100B. In some embodiments, the vertical NAND memory cell string 400A (or string 400A) can have a similar configuration to the vertical NAND memory cell string 400B. As shown in FIG. 22, the string 400A can have a source contact 142, a lowermost wordline 106a that functions as a gate electrode of a select gate source (SGS) transistor 402, a plurality of wordlines 106b-106g positioned over the lowermost wordline 106a and function as gate electrodes of control gates (CG) of the memory cells, an uppermost wordline 106h that functions as a gate electrode of a select gate drain (SGD) transistor 404, a top channel contact 146 and a bitline (BL) 150 over the top channel contact 146. The string 400A can have a channel structure 406 that extends from the substrate and further extend through the wordlines 106. The channel structure 406 can have a charge trap layer 140, the source contact 142, the channel layer 144, and a top channel contact 146. The memory cells are formed of the channel structure 406 and the wordlines 106b-106g. The SGS transistor 402 is formed of the wordline 106a and the channel structure 406. The SGD transistor 404 is formed of the wordline 106h and the channel structure 406. The strings 400A and 400B can further be coupled to a select line (SL). The SL is configured to perform wordline selection for operation.

Figure 23:
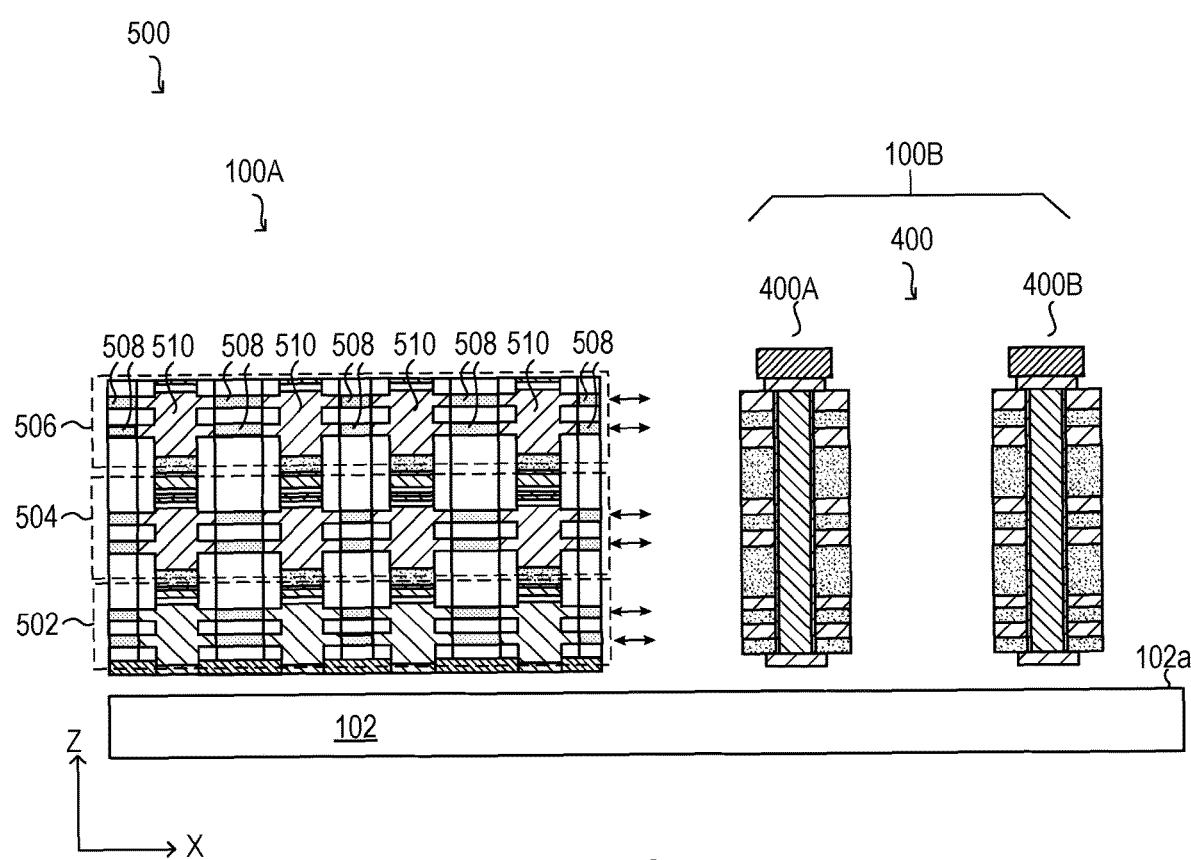
FIG. 23 is a semiconductor device that is formed in the stack and formed of a CFET device and a 3D NAND memory device, in accordance with some embodiments.

Conventional processing can continue to finish the 3D NAND memory and all connections for BL, WL, and CG (not shown). The completed 3D NAND memory can then be covered and protected while processing switches to logic region 100A to create 3D logic transistors, which can include CFET or vertical stacks of gate-all-around nano channels. An exemplary embodiment can be shown in FIG. 23. As shown in FIG. 23, a semiconductor device 500 can have a logic region 100A on a die having a stack of gate-all-around field-effect transistors (GAA-FETs) positioned over a substrate 102. For example, the stack of GAA-FETS can have three layers 502-506 of GAA-FETs that are positioned over the substrate 102. The stack of GAA-FETs can be formed in the first region 100A that includes the alternating first layers and second layers. Each layer of the stack of GAA-FETs can include respective GAA-FETs. Source/drain (S/D) regions and channel regions of the respective GAA-FETs in each layer of the stack of GAA-FETs can be disposed alternatingly and extend along a top surface of the substrate 102. For example, in the layer 506, S/D regions 510 and channel regions 508 of the GAA-FETs in the layer 506 are disposed alternatingly and extend along the top surface 102a of the substrate 102. The S/D regions 510 and the channel regions 508 of the GAA-FETs in the layer 506 can further be coupled to each other. In addition, the channel regions of the respective GAA-FETs in each layer of the stack of GAA-FETs can be formed based on the first layers 106. For example, the channel regions 508 of the GAA-FETs in the layer 506 can include two layers of first layers 106.

Still referring to FIG. 23, the 3D NAND memory 400 is positioned in the memory region 100B of the die, where the memory region 100B is adjacent to the logic region 100A. The 3D NAND memory 400 has an array of vertically-oriented NAND memory cells (e.g., 400A and 400B) that are formed in a memory region 100B. In the memory region 100B, the first layers and the insulating layers are positioned alternatingly over the substrate 102, and the first layers function as wordlines of the array of vertically-oriented NAND memory cells. Moreover, the logic region 100A and the memory region 100B are formed from an epitaxial stack (e.g., epitaxial stack 100) so that the first layers in the logic region 100A align with the first layers in the memory region 100B.

In some embodiments, the GAA-FETs in the layers 504 and 506 can be N-type transistors and the GAA-FETs in the layer 502 can be P-type transistors. In some embodiments, the GAA-FETs in the layers 504 and 506 can be P-type transistors and the GAA-FETs in the layer 502 can be N-type transistors according to the circuit designs.

In some embodiments, the 3D NAND memory 400 in the memory region 100B and the GAA-FTEs in the logic region 100A can be coupled to each other. The 3D NAND memory 400 can function as a memory component to save data generated from the GAA-FTEs in the logic region 100A, or provide data to the GAA-FTEs for data operation.

Accordingly, techniques herein provide a 3D logic region and a 3D memory region that are adjacent to each other, both of which started from a common epitaxial stack.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of forming a semiconductor device, the method comprising:
    forming a stack on a working surface of a substrate, the stack having alternating first layers and second layers positioned over the substrate;
    forming a separation structure in the stack that separates the stack into a first region and a second region such that the first layers in the first region align with the first layers in the second region along a direction perpendicular to the working surface of the substrate, the separation structure extending in a first direction of the substrate and including a dielectric material;
    replacing the second layers in the second region with insulating layers and doping the first layers in the second region with a dopant;

forming a 3D NAND device in the second region such that wordlines of the 3D NAND device are formed from the first layers in the second region; and forming a stack of gate-all-around field-effect transistors (GAA-FETs) in the first region that are positioned over the substrate such that channel regions of the GAA-FETs are formed from the first layers in the first region.

2. The method of claim 1, wherein the forming the stack comprises:

forming the first layers and the second layers alternatingly through an epitaxy growth process over the substrate, the first layers being made of silicon, and the second layers being made of silicon germanium.

3. The method of claim 2, wherein the doping the first layers in the second region comprises:

doping the first layers in the second region with a N-type dopant.

4. The method of claim 2, wherein replacing the second layers in the second region further comprises:

forming trenches along the first direction of the substrate in the second region to separate the second region into fin structures while the first region is protected, the fin structures including the alternating first layers and second layers, the trenches and the fin structures being arranged alternatingly along a second direction of the substrate that is perpendicular to the first direction of the substrate;

forming first support structures extending in the second direction of the substrate, the first support structures being positioned at the trenches so that first portions of the fin structures are uncovered by the first support structures and second portions of the fin structures are covered by the first support structures;

removing first portions of the second layers in the first portions of the fin structures;

doping first portions of the first layers in the first portions of the fin structures with the dopant;

replacing the first portions of the second layers in the first portions of the fin structures with the insulating layers;

removing the first support structures;

forming second support structures extending in the second direction of the substrate, the second support structures being positioned at the trenches so that the first portions of the fin structures are covered by the second support structures and the second portions of the fin structures are uncovered;

removing second portions of the second layers in the second portions of the fin structures;

doping second portions of the first layers in the second portions of the fin structures with the dopant;

replacing the second portion of the second layers in the second portions of the fin structures with the insulating layers; and removing the second support structures so that the fin structures include the insulating layers and the doped first layers arranged alternatingly on the working surface of the substrate.

5. The method of claim 4, wherein the forming the 3D NAND device in the second region further comprises:

forming the 3D NAND device in one of the fin structures in the second region.

6. The method of claim 5, wherein forming the 3D NAND device in the one of the fin structures in the second region further comprises:

performing an etching process to form staircase regions and an array region in the one of the fin structures, the array region being positioned between the staircase regions;

forming an channel structure in the array region of the one of the fin structures, the channel structure passing through the one of the fin structures and extending along a third direction of the substrate that is perpendicular to the substrate; and forming wordline contacts in the staircase regions, the wordline contacts landing on the first layers of the one of the fin structures, and further extending along the third direction of the substrate.

7. The method of claim 6, wherein forming the channel structure further comprises:

forming a channel opening in the one of the fin structures, the channel opening passing through the one of the fin structures along the third direction of the substrate and further extending into the substrate, the channel opening having sidewalls and a bottom;

forming a blocking layer along the sidewalls of the channel opening and over the bottom of the channel opening;

forming a charge storage layer over the blocking layer in the channel opening; and forming a tunneling layer over the charge storage layer in the channel opening.

8. The method of claim 7, wherein forming the channel structure further comprises:

performing an etching process to remove a portion of the blocking layer, a portion of the charge storage layer, and a portion of the tunneling layer that are positioned over the bottom of the channel opening;

forming a bottom channel contact at the bottom of the channel opening, the bottom channel contact further extending in the substrate;

forming a channel layer in the channel opening, the channel layer being disposed over the tunneling layer and positioned along the sidewalls of the channel opening, the channel layer further being positioned on the bottom channel contact; and forming a top channel contact on the channel layer.

9. The method of claim 1, wherein the forming the stack of gate-all-around field-effect transistors in the first region further comprises:

forming a first layer of the stack of GAA-FETs over the substrate, the first layer of the stack of GAA-FETs including first GAA-FETs, source/drain regions and channel regions of the first GAA-FETs being disposed alternatingly and arranged along a top surface of the substrate; and forming a second layer of the stack of GAA-FETs over the first layer of the stack of GAA-FETs, the second layer of the stack of GAA-FETs having second GAA-FETs, source/drain regions and channel regions of the second GAA-FETs being disposed alternatingly and positioned along the top surface of the substrate.

10. The method of claim 9, wherein the first GAA-FETs are N-type and the second GAA-FETs are P-type.

11. The method of claim 10, wherein the channel regions of the first GAA-FETs and the channel regions of the second GAA-FETs are formed in the first layers.

12. A semiconductor device comprising:

a first region on a die having a stack of gate-all-around field-effect transistors (GAA-FETs) positioned over a substrate, the stack of GAA-FETs being formed based on a first stack of alternating first layers and second layers, each layer of the stack of GAA-FETs including respective GAA-FETs, source/drain regions and channel regions of the respective GAA-FETs in each layer of the stack of GAA-FETs being disposed alternatingly and extending along a top surface of the substrate, the channel regions of the respective GAA-FETs in each layer of the stack of GAA-FETs being formed based on the first layers of the first stack; and a second region on the die positioned adjacent to the first region, the second region having an array of vertically-oriented NAND memory cells that are formed in a second stack, the second stack including the first layers and insulating layers that are positioned alternatingly over the substrate, the first layers in the second stack functioning as wordlines of the array of vertically-oriented NAND memory cells, wherein:

the first stack and the second stack are formed from an epitaxial stack so that the first layers in the first stack align with the first layers in the second stack along a direction perpendicular to the substrate.

13. The semiconductor device of claim 12, wherein the epitaxial stack comprises the first layers and the second layers that are disposed alternatingly on the substrate.

14. The semiconductor device of claim 13, wherein the first layers are made of silicon and the second layers are made of SiGe.

15. The semiconductor device of claim 13, wherein the epitaxial stack is separated into the first stack and the second stack by a separation structure, the separation structure extending in a first direction of the substrate.

16. The semiconductor device of claim 15, wherein the second layers in the second stack are replaced with the insulating layers.

17. The semiconductor device of claim 16, wherein the first layers in the second stack are doped with a dopant.

18. The semiconductor device of claim 17, wherein the array of vertically-oriented NAND memory cells further comprises:

staircase regions and an array region that are formed in the second stack;

channel structures formed in the array region, the channel structures extending along a vertical direction perpendicular to the substrate and further passing through the first layers and the insulating layers in the array region; and wordline contacts formed in the staircase regions, the wordline contacts landing on the first layers in the staircase regions and further extending along the vertical direction.

19. The semiconductor device of claim 18, wherein one of the channel structures further comprises:

a bottom channel contact positioned at a bottom of the one of the channel structures, the bottom channel contact further extending in the substrate;

a blocking layer positioned along sidewalls of the one of the channel structures, a bottom end of the blocking layer being positioned on the bottom channel contact;

a charge storage layer positioned along sidewalls of the blocking layer, a bottom end of the charge storage layer being positioned on the bottom channel contact;

a tunneling layer positioned along sidewalls of the charge storage layer, a bottom end of the tunneling layer being positioned on the bottom channel contact;

a channel layer positioned along sidewalls of the tunneling layer, the channel layer being positioned on the bottom channel contact; and a top channel contact disposed on the channel layer.

\* \* \* \* \*